United States Patent
Obara et al.

(10) Patent No.: US 9,857,124 B2
(45) Date of Patent: Jan. 2, 2018

(54) CLAMP APPARATUS, SUBSTRATE CARRY-IN/OUT APPARATUS USING THE SAME, AND SUBSTRATE PROCESSING APPARATUS

(71) Applicant: Tokyo Electron Limited, Tokyo (JP)

(72) Inventors: Mitsuru Obara, Iwate (JP); Hisashi Inoue, Iwate (JP); Keishi Shionaga, Iwate (JP); Masahiro Kobayashi, Iwate (JP); Norio Baba, Iwate (JP); Hiroshi Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/070,123

(22) Filed: Mar. 15, 2016

(65) Prior Publication Data

US 2016/0273836 A1  Sep. 22, 2016

(30) Foreign Application Priority Data

Mar. 20, 2015  (JP) .................................. 2015-058160

(51) Int. Cl.
*F26B 5/04* (2006.01)
*F27B 5/04* (2006.01)
(Continued)

(52) U.S. Cl.
CPC .................. *F27B 5/04* (2013.01); *F16B 2/02* (2013.01); *F27B 17/0016* (2013.01); *F27B 17/0025* (2013.01); *F27D 3/0084* (2013.01); *H01L 21/6773* (2013.01); *H01L 21/67109* (2013.01); *H01L 21/67379* (2013.01); *H01L 21/67389* (2013.01); *H01L 21/67742* (2013.01);
(Continued)

(58) Field of Classification Search
CPC .......... F26B 5/04; F16B 2/02; F27B 17/0016; F27B 17/0025; F27D 3/084; F27D 2003/0012; F27D 2003/0046; H01L 21/67109; H01L 21/6773; H01L 21/67772; H01L 21/67742; H01L 21/67775
USPC ............................................. 34/78
See application file for complete search history.

(56) References Cited

U.S. PATENT DOCUMENTS 4,913,790 A * 4/1990 Narita ..................... C23C 14/02
204/192.13
5,628,121 A * 5/1997 Brooks ............. H01L 21/67393
141/93
(Continued)

FOREIGN PATENT DOCUMENTS

JP      2012-204645 A    10/2012
JP   WO 2013081013 A1 *  6/2013 ....... H01L 21/67017
(Continued)

*Primary Examiner* — Stephen M Gravini
(74) *Attorney, Agent, or Firm* — Abelman, Frayne & Schwab

(57) ABSTRACT

The clamp apparatus of the present disclosure includes a clamp member configured to contact a substrate accommodating container from an upper side and fix the substrate accommodating container to a predetermined position when a cover provided on a front surface of the substrate accommodating container is opened/closed, a driving mechanism configured to drive the clamp member; a casing configured to cover the driving mechanism, a suction port configured to communicate with the casing, an exhaust chamber provided near the casing, and a fan provided inside the exhaust chamber.

16 Claims, 19 Drawing Sheets

(51) Int. Cl.
*H01L 21/673* (2006.01)
*H01L 21/677* (2006.01)
*H01L 21/67* (2006.01)
*F16B 2/02* (2006.01)
*F27B 17/00* (2006.01)
*F27D 3/00* (2006.01)

(52) U.S. Cl.
CPC .. *H01L 21/67772* (2013.01); *H01L 21/67775* (2013.01); *F27D 2003/0012* (2013.01); *F27D 2003/0046* (2013.01)

(56) References Cited

U.S. PATENT DOCUMENTS

| | | | | |
|---|---|---|---|---|
| 5,671,544 A | * | 9/1997 | Yokomizo | F26B 21/145 34/169 |
| 5,950,328 A | * | 9/1999 | Ichiko | H01L 21/67034 34/364 |
| 5,956,859 A | * | 9/1999 | Matsumoto | H01L 21/67034 34/208 |
| 6,319,322 B1 | * | 11/2001 | Ueda | H01L 21/67109 118/319 |
| 7,581,335 B2 | * | 9/2009 | Tanaka | H01L 21/67028 118/900 |
| 7,654,010 B2 | * | 2/2010 | Moriya | H01L 21/67017 118/65 |
| 7,877,895 B2 | * | 2/2011 | Otsuka | H01L 21/67748 118/725 |
| 7,980,003 B2 | * | 7/2011 | Aoki | H01L 21/67109 34/443 |
| 8,701,308 B2 | * | 4/2014 | Hiroshiro | H05B 3/0052 118/723 E |
| 9,165,810 B2 | * | 10/2015 | Hiroki | H01L 21/67017 |
| 9,349,620 B2 | | 5/2016 | Kamata | H01L 21/67775 |
| 9,578,688 B2 | | 2/2017 | Sato | H05B 3/0047 |
| 9,623,516 B2 | | 4/2017 | Kondo | B23K 26/0626 |
| 9,644,891 B2 | * | 5/2017 | Zielinski | F26B 5/04 |
| 2008/0308134 A1 | * | 12/2008 | Maeda | B08B 7/0035 134/137 |
| 2016/0273836 A1 | * | 9/2016 | Obara | F27B 17/0016 |

FOREIGN PATENT DOCUMENTS

| | | | | |
|---|---|---|---|---|
| JP | | 2014-067744 A | 4/2014 | |
| JP | KR | 20140100484 A | * 8/2014 | ....... H01L 21/67017 |
| JP | | 5603314 B2 | * 10/2014 | ....... H01L 21/67017 |

* cited by examiner

CLAMP APPARATUS, SUBSTRATE CARRY-IN/OUT APPARATUS USING THE SAME, AND SUBSTRATE PROCESSING APPARATUS

CROSS-REFERENCE TO RELATED APPLICATIONS

This application is based on and claims priority from Japanese Patent Application No. 2015-058160, filed on Mar. 20, 2015, with the Japan Patent Office, the disclosure of which is incorporated herein in its entirety by reference.

TECHNICAL FIELD

The present disclosure relates to a clamp apparatus, a substrate carry-in/out apparatus using the same, and a substrate processing apparatus.

BACKGROUND

Conventionally, a semiconductor manufacturing apparatus has been provided with a cover opening/closing device in order to suppress particles in a transfer section of a front opening unified pod (FOUP) from being mixed into a substrate transfer section through a cover of the FOUP. A cover opening/closing device known in the related art includes a mounting table, on which a FOUP is mounted such that the front surface of the cover of the FOUP faces a transfer port opened/closed by an opening/closing door, a gas ejection port provided in a surface that is opposite to the FOUP, and a reciprocating mechanism that reciprocates the FOUP mounted on the mounting table in relation to the opposite surface (see, e.g., Japanese Laid-Open Patent Publication No. 2012-204645). In the cover opening/closing device described in Japanese Laid-Open Patent Publication No. 2012-204645, when the distance from the gas ejection port to the cover of the FOUP is 5 mm or shorter, a purge gas is supplied to the cover so that the flow rate of the purge gas flowing between the cover and the opposite surface increases, thereby enabling particles on the cover to be easily removed.

In addition, a transfer apparatus known in the related art includes a ground element such that, even when a wafer charged with electricity is accommodated in the transfer apparatus, the wafer is suppressed from being contaminated by particles existing within the transfer apparatus (see, e.g., Japanese Laid-Open Patent Publication No. 2014-067744). The conveyance apparatus described in Japanese Laid-Open Patent Publication No. 2014-067744 includes a holding table including a first positioning pin that positions a transferred object and configured to deliver a wafer accommodated in the transferred object, an arm unit configured to grasp the transferred object so as to dispose the transferred object on the holding table, and a support unit configured to fix the transferred object disposed on the holding table. At least one of the first positioning pin, the arm unit, and the support unit includes the ground element.

According to the cover opening/closing apparatus and the transfer apparatus described above, some effects may be obtained in suppressing particles from being mixed into a substrate transfer section when a FOUP or a substrate (or wafer) accommodated in a transferred object is carried into the substrate transfer section.

SUMMARY

A clamp apparatus according to an aspect of the present disclosure includes: a clamp member configured to come in contact with a substrate accommodating container from an upper side so as to fix the substrate accommodating container to a predetermined position when a cover provided on a front side of the substrate accommodating container is opened/closed; a driving mechanism configured to drive the clamp member; a casing configured to cover the driving mechanism; an exhaust chamber provided near the casing and including a suction port configured to communicate with the casing; and a fan provided within the exhaust chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
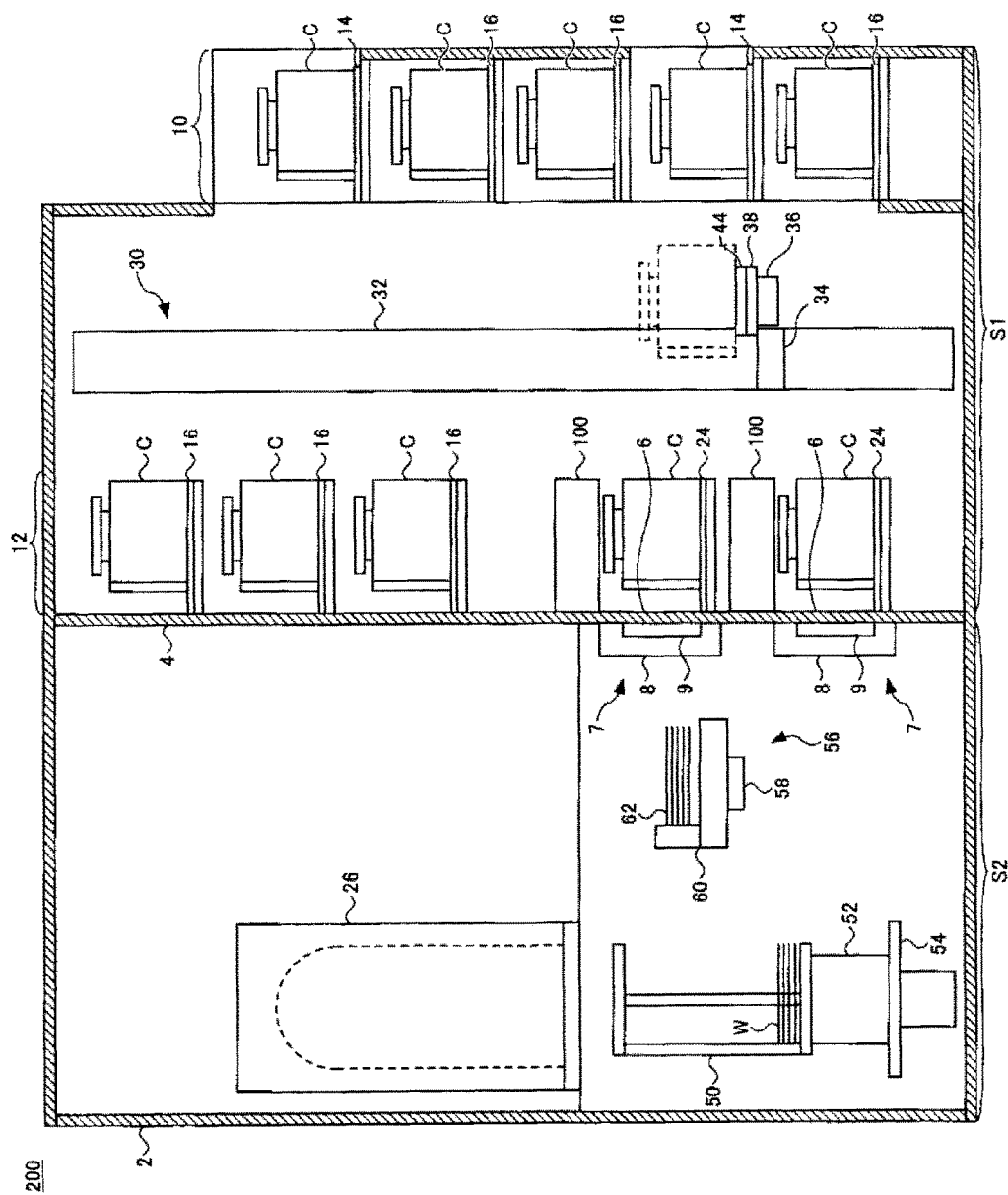
FIG. 1 is a schematic configuration view of an exemplary substrate processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Recently, from the viewpoint of controlling the investment in semiconductor manufacturing plants and reducing costs, there is a demand for securing the cleanliness in a transfer apparatus side (e.g., a FOUP or a FIMS (Front-opening Interface Mechanical Standard)) by reducing the cleanliness of a substrate accommodating container (e.g., the FOUP) transfer section in a clean room while keeping the cleanliness in an actual substrate processing section in the clean room high.

In order to respond to such a demand, it is desirable to implement a structure that suppresses particles attached to, for example, the cover of a substrate accommodating container (e.g., a FOUP) from being mixed into the substrate transfer section (e.g., a substrate processing section) when the substrate accommodating container is carried into the substrate transfer section, and also suppresses scattering of particles generated in a mechanical mechanism when the cover of the substrate accommodating container is opened/closed.

Thus, an object of the present disclosure is to provide a clamp apparatus, which is able to reduce scattering of particles in a clamp mechanism that is required for fixing a substrate accommodating container (e.g., a FOUP) when taking out a substrate from the substrate accommodating container and carrying the substrate into the substrate transfer section, a substrate carry-in/out apparatus using the clamp mechanism, and a substrate processing apparatus.

The clamp apparatus according to an aspect of the present disclosure includes: a clamp member configured to come in contact with a substrate accommodating container from an upper side so as to fix the substrate accommodating container to a predetermined position when a cover provided on a front side of the substrate accommodating container is opened/closed; a driving mechanism configured to drive the clamp member; a casing configured to cover the driving mechanism; an exhaust chamber provided near the casing and including a suction port configured to communicate with the casing; and a fan provided within the exhaust chamber.

The above-described clamp apparatus further include a local exhaust duct that is provided inside the casing and selectively disposed near the driving mechanism.

In the above-described clamp apparatus, the local exhaust duct communicates with the suction port.

In the above-described clamp apparatus, the casing and the exhaust chamber are located adjacent to each other, and a discharge port of the local exhaust duct is directly connected to the suction port.

In the above-described clamp apparatus, exhaust chambers are provided adjacent to the opposite sides of the casing, respectively, and the fan is provided in each of the opposite sides of the casing.

In the above-described clamp apparatus, the exhaust chambers provided adjacent to the opposite sides of the casing communicate, respectively, with each other.

In the above-described clamp apparatus, the casing includes a movable portion configured to be connected to the clamp member and movable up and down together with the clamp member, and a fixed portion configured to accommodate at least a part of the driving mechanism and the local exhaust duct.

In the above-described clamp apparatus, the driving mechanism includes a driving force generating unit configured to generate a driving force and a moving unit configured to move by the driving force. The movable portion accommodates at least a part of the moving unit, and the fixed portion accommodates the driving force generating unit.

In the above-described clamp apparatus, the movable portion is provided by being inserted into an opening of the bottom of the fixed portion, and a wall is formed in at least a part of the periphery of the opening to be parallel with a side surface of the movable portion.

The above-described clamp apparatus further includes a cover member having a shape continuous and integral with the exhaust chamber and configured to cover the casing.

In the above-described clamp apparatus, the fan is a sirocco fan.

In the above-described clamp apparatus, a cleaning filter is further provided inside the exhaust chamber, and the gas sucked from the suction port may be supplied through the cleaning filter to a predetermined position to which the substrate accommodating container may be fixed.

In the above-described clamp apparatus, the cleaning filter is provided on the bottom surface of the exhaust chamber.

In the above-described clamp apparatus, the exhaust chamber is divided into a negative pressure chamber provided with the fan and a positive pressure chamber provided with the cleaning filter, and the gas introduced into the negative pressure chamber by blowing of the fan is sent to the positive pressure chamber.

In the above-described clamp apparatus, the negative pressure chamber is provided in the top surface side of the exhaust chamber, a second suction port is provided on the top surface of the negative pressure chamber, and the fan also sucks a gas from the second suction port to blow the gas into the positive pressure chamber.

A substrate carry-in/out apparatus according to another aspect of the present disclosure includes a substrate transfer section, a partition wall configured to partition a substrate accommodating container transfer section, a transfer port provided on the partition wall, an opening/closing door configured to open/close the transfer port, the above-described clamp apparatus that is attached to the substrate accommodating container transfer section side of the partition wall above the transfer port, and a side cover provided on each of opposite sides of the transfer port in a horizontal direction at the substrate accommodating container transfer section side of the partition wall.

In the above-described substrate carry-in/out apparatus, the transfer port, the opening/closing door, the clamp apparatus, and the side cover are provided on the partition wall in two tiers in a vertical direction.

The above-described substrate carry-in/out apparatus further includes a cover opening/closing device provided within the substrate transfer section to open/close the cover of the substrate accommodating container.

A substrate processing apparatus according to another aspect of the present disclosure includes the above-described substrate carry-in/out apparatus, a transfer mechanism provided within the substrate transfer section to transfer the substrate, and a processing container provided within the substrate transfer section.

In the above-described substrate processing apparatus, the processing container is a heat treatment furnace configured to thermally treat a substrate.

According to the present disclosure, it is possible to reduce the scattering of particles from the clamp apparatus in the FIMS port.

Hereinafter, exemplary embodiments to implement the present disclosure will be described with reference to the drawings.

[Substrate Processing Apparatus]

Figure 2:
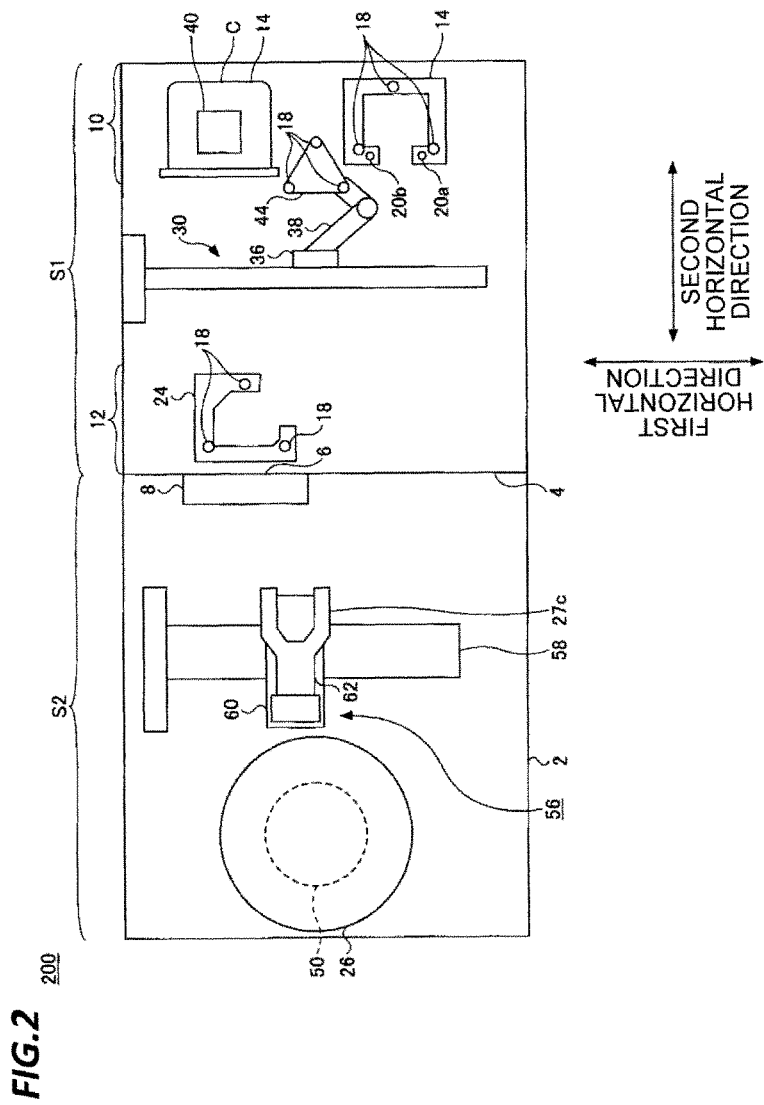
FIG. 2 is a schematic plan view of the exemplary substrate processing apparatus according to the exemplary embodiment of the present disclosure.
Figure 3:
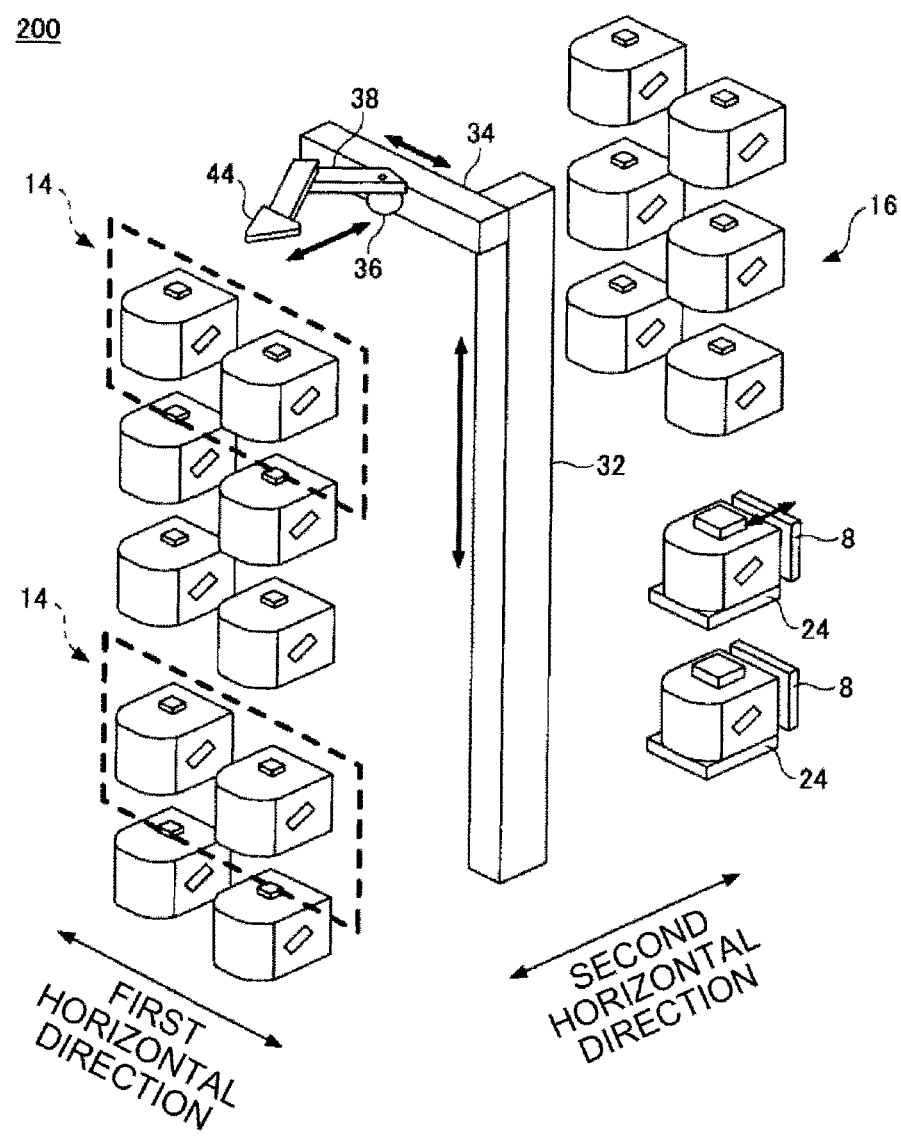
FIG. 3 is a schematic perspective view of an exemplary carrier transfer section according to an exemplary embodiment of the present disclosure.

First, descriptions will be made on an exemplary configuration of a substrate processing apparatus according to an exemplary embodiment of the present disclosure, which uses a clamp apparatus according to an exemplary embodiment of the present disclosure. FIG. 1 illustrates a schematic configuration view of an exemplary substrate processing apparatus according to an exemplary embodiment of the present disclosure. FIG. 2 illustrates a schematic plan view of the exemplary substrate processing apparatus according to the exemplary embodiment of the present disclosure. FIG. 3 illustrates a schematic perspective view of an exemplary carrier transfer section according to an exemplary embodiment of the present disclosure. For explanation, FIG. 2 illustrates a state in which one side of load ports 14, FIMS ports 24, and carriers C of FIG. 1 are not arranged.

The clamp apparatus according to an exemplary embodiment of the present disclosure may be applied to various substrate apparatuses including a vertical type heat treatment apparatus. In order to facilitate understanding, the present exemplary embodiment will be described with reference to an example in which a vertical type heat treatment apparatus is used as one of specific substrate processing apparatuses.

As illustrated in FIG. 1, a substrate processing apparatus 200 is configured to be accommodated in a case 2 that constitutes an exterior body of the apparatus. A carrier transfer section S1 and a wafer transfer section S2 are formed in the case 2. In the carrier transfer section S1, a carrier C which is a container that accommodates a semiconductor wafer W as an object to be processed (hereinafter, referred to as a "wafer W") is carried in/out with respect to the substrate processing apparatus. In the wafer transfer section S2, the wafer W inside the carrier C is transferred to be carried into a heat treatment furnace 26 which will be described later.

The detailed configuration of the carrier C will be described later. When the wafer W is transferred, the wafer W is accommodated in a substrate accommodating container called a front opening unified pod (FOUP), and the cleanliness in the container is maintained at a predetermined level, in order to suppress attachment of contaminants to the surface of the wafer W or formation of a natural oxide film thereon.

The carrier transfer section S1 and the wafer transfer section S2 are partitioned by a partition wall 4. The carrier transfer section S1 is under the air atmosphere, and is configured to transfer a carrier C that accommodates a wafer W therein between the components inside the substrate processing apparatus 200 which will be described later, i.e., to carry a carrier C into the substrate processing apparatus 200 from the outside or carry out a carrier C from the substrate processing apparatus 200 to the outside. Meanwhile, the wafer transfer section S2 is configured to take out the wafer W from the carrier C and perform various processings, and is under an inert gas atmosphere (e.g., a nitrogen ($N_2$) gas atmosphere) in order to suppress formation of an oxide film on the wafer W. In the following descriptions, the arrangement direction of the carrier transfer section S1 and the wafer transfer section S2 (corresponding to a second horizontal direction to be described later) will be referred to as a front-and-rear direction, the carrier transfer section S1 side will be referred to as the front direction, and the wafer transfer section S2 side will be referred to as the rear direction. Further, a horizontal direction orthogonal to the front-and-rear direction will be referred to as a left-to-right direction (corresponding to a first horizontal direction to be described later).

A filter unit (not illustrated) such as, for example, a high efficiency particulate air (HEPA) filter or an ultra-low penetration air (ULPA) filter may be provided on the ceiling or the side wall of the wafer transfer section S2, and cleaned air may be supplied into the wafer transfer section S2 by the filter.

A transfer port 6 is provided on the partition wall 4 to transfer the wafer W between the carrier transfer section S1 and the wafer transfer section S2. The transfer port 6 is opened and closed by a door mechanism 8 according to a front opening interface mechanical standard (FIMS). The door mechanism 8 includes a mechanism configured to remove the cover provided on the front side of the carrier in cooperation with an opening/closing door 9 configured to open/close the transfer port 6 (see, e.g., FIG. 6). The door mechanism 8 has a function to open/close the cover in order to transport the wafer W between the inside of the carrier and the wafer transfer section and a function to separate the wafer transfer section S2 from the carrier transfer section S1.

The carrier transfer section S1 will be described. The carrier transfer section S1 is configured by a first transfer section 10 and a second transfer section 12, which is located behind the first transfer section 10.

As illustrated in FIG. 1, the first transfer section 10 is provided with load ports 14, for example, in two tiers in the vertical direction, and two load ports 14 are provided side by side on each of the tiers (FIG. 2). Each of the load ports 14 is a carry-in placement table that receives a carrier C when the carrier C is carried into the substrate processing apparatus 200.

Each of the load ports 14 is provided in an opened portion of the wall of the case 2 and configured to enable access to the substrate processing apparatus 200 from the outside. Specifically, carry-in and placement of the carrier C on each of the load ports 14 and carry-out of the carrier C from each of the load ports 14 to the outside may be performed by a transfer apparatus (not illustrated) provided outside the substrate processing apparatus 200 according to the present exemplary embodiment. Further, the load ports 14 are provided, for example, in two tiers in the vertical direction, which enables carry-in/out of carriers C in two directions.

A stocker 16 may be provided below each of the vertical two-tier load ports 14 of the first transfer section 10 so as to store a carrier C.

As illustrated in FIG. 2, positioning pins 18 are provided at, for example, three portions on a carrier C placement surface of each of the load ports 14 so as to position a carrier C. Each load port 14 may be configured to be movable in the front-and-rear direction in a state where a carrier C is placed on the load port 14.

As illustrated in FIG. 2, each load port 14 may be provided with a supply nozzle 20a and an exhaust nozzle 20b. In general, an air intake port 22a and an exhaust port 22b are provided on the bottom surface of each carrier C (see, e.g., FIG. 4B to be described later). Each load port 14 may be configured such that when the carrier C is placed on the load port 14, the supply nozzle 20a is arranged at a position corresponding to the air intake port 22a of the carrier C, and the exhaust nozzle 20b is arranged at a position corresponding to the exhaust port 22b of the carrier C. The supply nozzle 20a and the exhaust nozzle 20b are provided so that nitrogen substitution in the inside of the carrier C may be performed by supplying an inert gas into the carrier C when the carrier C is placed on the load port 14. Accordingly, when the carrier C is transferred in a state where no inert gas is supplied while the inside space of the carrier C is filled with the inert gas, the supply of the inert gas may be restarted immediately in the stage where the carrier C is carried in the load port 14.

Two FIMS ports 24 are arranged in the vertical direction in a lower portion of the second transfer section 12. Each FIMS port 24 is a holding table configured to hold a carrier C when a wafer W inside the carrier C is carried in/out from a heat treatment furnace to be described later within the wafer transfer section S2. The FIMS ports 24 are configured to be movable in the front-and-rear direction. As illustrated in FIG. 2, positioning pins 18 are also provided at three portions on the placement surface of each FIMS port 24 to position the carrier C, like the load ports 14.

A clamp apparatus 100 is provided above each FIMS port 24 so as to fix the carrier C. When a wafer W is carried out from the carrier C, a cover 68 of the carrier C is opened in a state in which the carrier C is in close contact with the partition wall 4. At that time, the clamp apparatus 100 performs a function to fix the carrier C to a predetermined position where the carrier C is in close contact with the partition wall 4. The clamp apparatus 100 according to the present exemplary embodiment has a configuration and a function to suppress particles from being scattered from the mechanical portion of the clamp apparatus 100 and suppress particles generated from the cover 68 of the carrier C from being drawn into the wafer transfer section S2. This point will be described in detail later.

Stockers 16 are provided in the upper portion of the second transfer section 12 to store carriers C. The stockers 16 are formed by two or more tiers of shelves (three tiers of shelves in the example illustrated in FIG. 1). Two or more carries may be placed on each shelf in the left-and-right direction. A stocker 16 may also be arranged in an area of the lower portion of the second transfer section 12 where no carrier placement table is provided.

As in the load ports 14, the above-described supply nozzle 20a and exhaust nozzle 20b may be provided on the bottom surface of each of the stockers 16 so that the inside of a carrier C placed on each of the stockers 16 may be substituted with an inert gas.

A carrier transfer mechanism 30 is provided between the first transfer section 10 and the second transfer section 12 to transfer a carrier C between a load port 14 and a FIMS port 24 or a stocker 16.

As illustrated in FIG. 2, the carrier transfer mechanism 30 includes a first guide unit 32 that extends vertically, a second guide unit 34 that is connected to the first guide unit 32 and extends in the left-and-right direction (in the first horizontal direction), a moving unit 36 that moves in the left-and-right direction while being guided by the second guide unit 34, and a (multiple-) joint arm unit 38 (two arm units having one joint in the example illustrated in FIG. 2) that is provided in the moving unit 36.

Further, as illustrated in FIG. 1, a hand unit 44 is provided at the front end of the multiple-joint arm unit 38. Positioning pins 18 are provided at three portions on the hand unit 44 to position a carrier C.

As described above, a wafer W transfer port 6 is provided on the partition wall 4 to make the carrier transfer section S1 and the wafer transfer section S2 communicate with each other. The transfer port 6 is provided with a door mechanism 8 that is configured to block the transfer port 6 from the wafer transfer section S2 side. A driving mechanism of a cover opening/closing device 7 is connected to the door mechanism 8. The door mechanism 8 is configured to be movable in the front-and-rear direction and in the vertical direction by the driving mechanism so that the transfer port 6 is opened and closed.

Next, the wafer transfer section S2 will be described.

The wafer transfer section S2 is provided with a vertical type heat treatment furnace 26 in which the bottom end is opened as a furnace port. The heat treatment furnace 26 is a processing container configured to accommodate the wafer W therein and perform a heat treatment by heating the wafer W. While the present exemplary embodiment exemplifies a processing container that is formed as a heat treatment furnace 26, the clamp apparatus, the substrate carry-in/out apparatus using the same, and the substrate processing apparatus according to the present exemplary embodiment may be applied to various substrate processing apparatuses. When the clamp apparatus, the substrate carry-in/out apparatus, and the substrate processing apparatus of the present exemplary embodiment are applied to a substrate processing apparatus other than a heat treatment apparatus, the processing container is configured to be suitable for the substrate processing performed by the corresponding substrate processing apparatus. Below the heat treatment furnace 26, a wafer boat 50 configured to hold a plurality of wafers W therein in the form of a shelf is mounted on a cap 54 through a heat insulating cylinder 52. In other words, the cap 54 is provided integrally with the wafer boat 50 below the wafer boat 50.

The cap 54 is supported on a lifting mechanism (not illustrated), and the wafer boat 50 is carried in or out from the heat treatment furnace 26 by the lifting mechanism.

The wafer boat 50 is formed of, for example, quartz and configured such that large caliber wafers W, e.g., 450 mm or 300 mm wafers are mounted in the wafer boat 50 in a horizontal state and at predetermined intervals in the vertical direction. The number of the wafers W accommodated in the wafer boat 50 is not limited, but is, for example, about 50 sheets to about 150 sheets.

A wafer transfer mechanism 56 is provided between the wafer boat 50 and the transfer port 6 of the partition wall 4. As illustrated in FIG. 2, the wafer transfer mechanism 56 is configured to perform transfer of wafers W between the carriers C held on the FIMS ports 24 and the wafer boat 50.

The wafer transfer mechanism 56 moves along a guide mechanism 58 that extends in the left-and-right direction and is configured to be provided with five reciprocating forks 62 (transfer plates) on a moving body 60 that rotates around a vertical axis.

[Carrier]

Next, a configuration of a carrier C will be described with reference to FIGS. 4A and 4B.

Figure 4A:
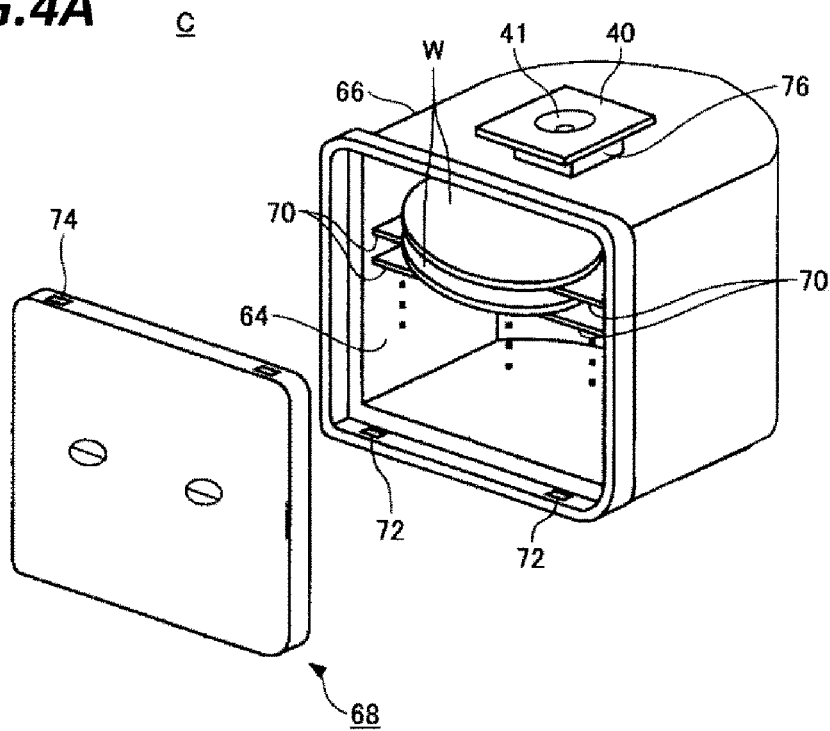
FIGS. 4A and 4B are schematic views illustrating a configuration of an exemplary carrier.

FIG. 4A illustrates a schematic perspective view of an exemplary carrier C. FIG. 4B illustrates a schematic view of an exemplary bottom surface of the carrier C.

The carrier C mainly includes an accommodating container body 66 having an opening 64 at one side thereof and a cover 68 configured to seal the opening 64.

The opening 64 formed in the accommodating container body 66 is configured to carry in/out the wafer W and provided at a side surface of the accommodating container body 66, i.e., a surface of the accommodating container body 66 that faces the transfer port 6 when the carrier C is placed on each of the FIMS ports 24.

Multiple tiers of support units (teeth) 70 are provided on the inner left and right sides of the accommodating container body 66 to support the rear surfaces of wafers W.

Engagement grooves 72 are formed in the inner periphery on the opening 64 side of the accommodating container body 66. Engagement units 74 of the cover 68 are engaged in the engagement grooves 72 so that the cover 68 is fixed to the accommodating container body 66.

For example, a rectangular head 76 is formed on the top surface of the carrier C, and a flange 40 is formed on the top end of the head 76 to protrude in a rectangular shape.

An engagement recess 41 is formed on the top surface of the flange 40 so as to enable the carrier C to be fixed by the clamp apparatus 100. The clamp apparatus 100 fixes the carrier C by using a clamp member that is adapted to be engaged in the engagement recess 41. The configuration and the function of the clamp apparatus 100 will be described in detail later.

Figure 4B:
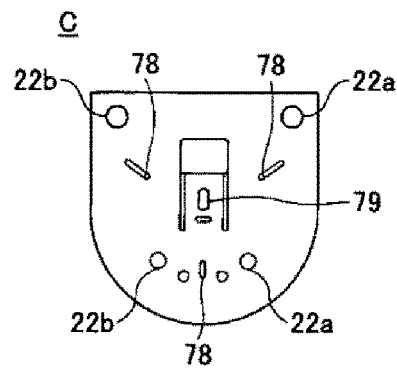

As illustrated in FIG. 4B, one or more positioning grooves 78 are formed on the bottom surface of the carrier C. As described above, positioning pins 18 are formed on each of the load ports 14, the stockers 16, the FIMS ports 24, and the carrier transfer mechanism 30 to be engaged in the positioning grooves 78, respectively. When the carrier C is placed on each of the load ports 14, the stockers 16, and the FIMS ports 24, or the carrier transfer mechanism 30, the carrier C is positioned at a predetermined position by the positioning pins 18 and the positioning grooves 78. Further, FIG. 4B illustrates an example where three positioning grooves are formed, but the number of the positioning grooves is not limited.

[Clamp Apparatus]

Next, descriptions will be made on the clamp apparatus 100 according to the present exemplary embodiment.

Figure 5:
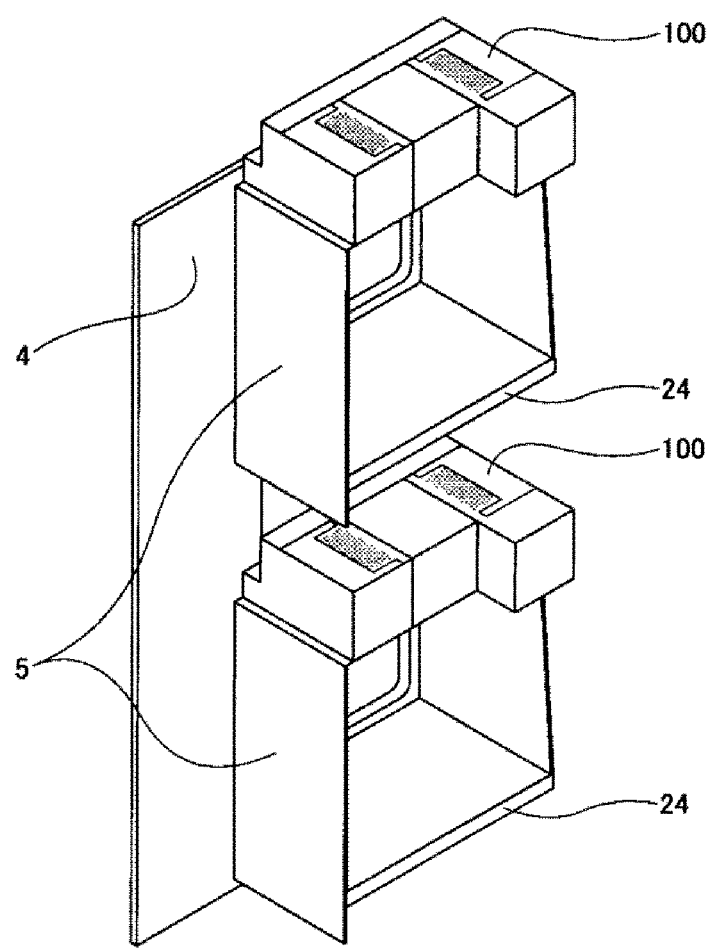
FIG. 5 is a perspective view illustrating a configuration in the vicinity of a front opening interface mechanical standard (FIMS) port mounted with an exemplary clamp apparatus according to an exemplary embodiment of the present disclosure.
Figure 6:
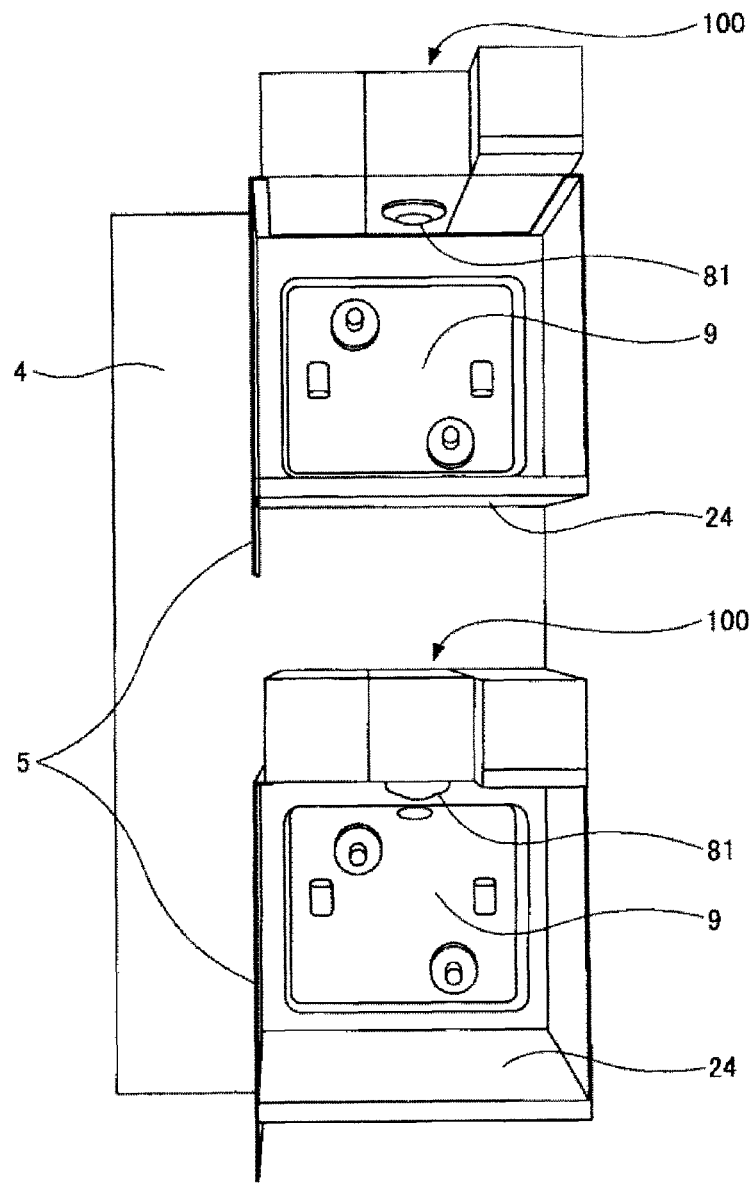
FIG. 6 is a front view illustrating the configuration of the vicinity of the FIMS port mounted with the exemplary clamp apparatus according to the exemplary embodiment of the present disclosure.

FIG. 5 is a perspective view illustrating a configuration in the vicinity of the FIMS ports 24 each mounted with the exemplary clamp apparatus 100 according to the present exemplary embodiment. FIG. 6 is a front view illustrating a configuration in the vicinity of the FIMS ports 24 each mounted with the exemplary clamp apparatus 100 according to the present exemplary embodiment.

As illustrated in FIG. 6, a clamp apparatus 100 is provided above each FIMS port 24 by being attached to the partition wall 14. More specifically, as illustrated in FIG. 6, a clamp apparatus 100 is provided above each opening/closing door 9. The opening/closing door 9 is a door configured to block a transfer port 6 from the wafer transfer section S2 side. The opening/closing door 9 is configured to be movable by the door mechanism 8 such that the opening/closing door 9 opens/closes the cover 68 of a carrier C in cooperation with the door mechanism 8. As illustrated in FIG. 6, a clamp member 81 is provided on the bottom surface of the clamp apparatus 100 and configured to be engaged in the engagement recess 41 formed on the top surface of the flange 40 of the carrier C and press and fix the engagement recess 41 when the carrier C is placed on the FIMS port 24. Further, as illustrated in FIG. 6, a side cover 5 is provided to surround the horizontal opposite sides of the opening/closing door 9 and configured to extend in the horizontal direction from the partition wall 4 perpendicularly to the partition wall 4. When the carrier C is placed on the FIMS port 24, the vicinity of the openings of the side surfaces of the carrier C may be covered by the side cover 5, and the vicinity of the opening of the top surface of the carrier C may be covered by the clamp apparatus 100 so that particles can be suppressed from being drawn into the carrier C from the outside.

Figure 7:
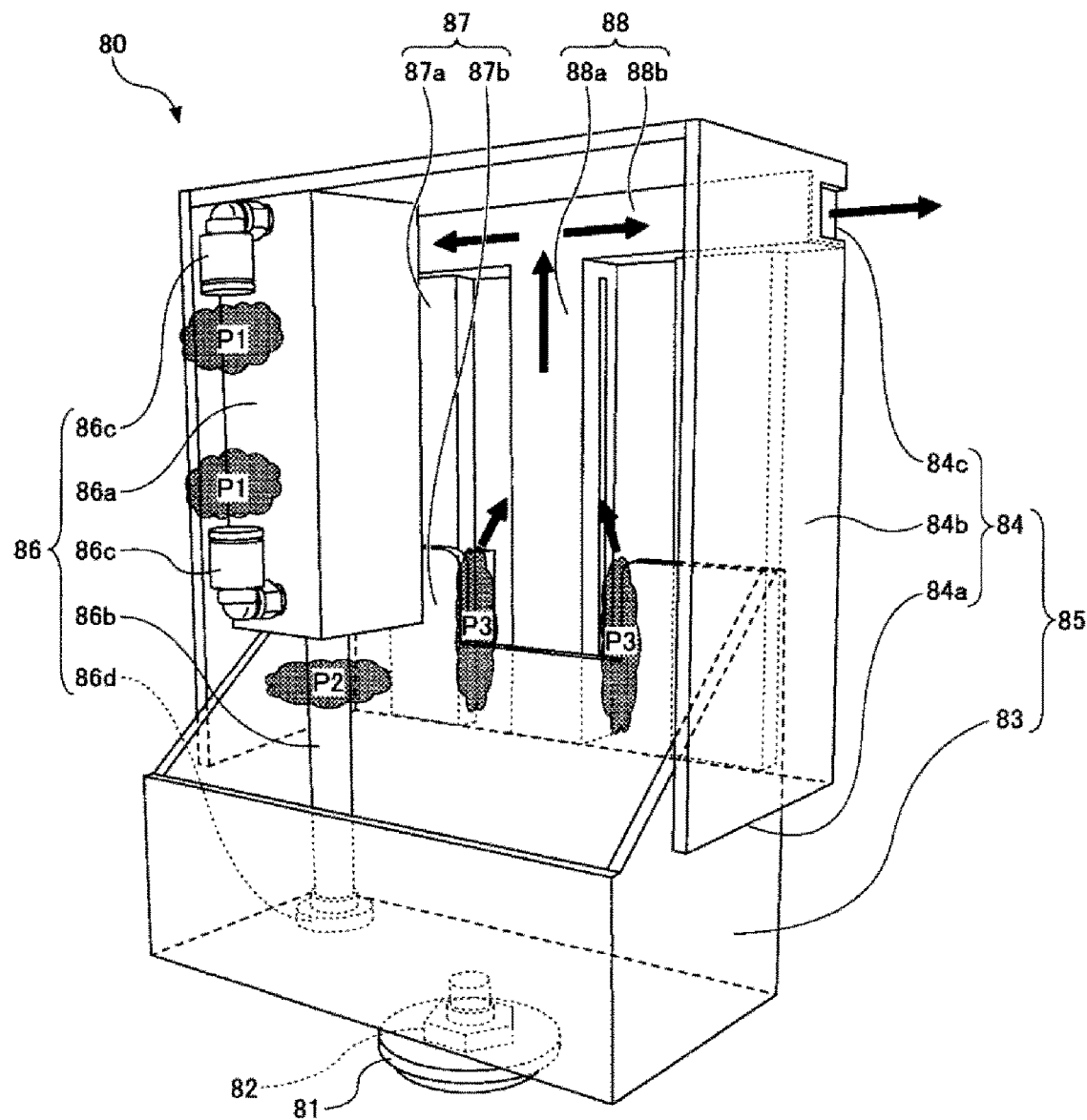
FIG. 7 is a view illustrating an internal configuration of an exemplary clamp mechanism part of the clamp apparatus according to the exemplary embodiment of the present disclosure.

FIG. 7 is a view illustrating an internal configuration of an exemplary clamp mechanism part 80 of the clamp apparatus 100 according to the present exemplary embodiment. The clamp mechanism part 80 includes a clamp member 81, a clamp fixing member 82, a casing 85, a driving unit 86, a linear guide 87, and a local exhaust duct 88. The casing 85 includes a movable casing portion 83 and a fixed casing portion 84. The driving unit 86 includes a driving force generating unit 86a, a cylinder rod 86b, an air duct 86c, and a cylinder rod fixing member 86d. The linear guide 87 includes a fixed linear guide portion 87a and a movable linear guide portion 87b.

The clamp member 81 is a means for fixedly holding a carrier C and is configured to come in contact with the carrier C and to be engaged in the engagement recess 41 of the flange 40 of the carrier C. Accordingly, the clamp member 81 has a shape that may be engaged in the engagement recess 41. Specifically, the clamp member 81 has a configuration in which a member having a truncated cone shape is attached to a bottom surface of a disc. The clamp member 81 moves down so as to be engaged in the engagement unit 41 and further presses the flange 40 so as to hold the carrier C. The clamp member 81 may be configured to have various shapes or structures as long as it is able to fix the carrier C.

The clamp fixing member 82 is a member for fixing the clamp member 81 to the bottom surface of the movable casing portion 83. The clamp fixing member 82 may be constituted with a fastening member such as, for example, a nut or other fixing members. The clamp fixing member 82 may be a fixing member that is able to adjust the height of the clamp member 81. As illustrated in FIG. 7, the clamp member 81 is provided to be exposed from the casing 85 and fixedly connected to the bottom surface of the movable casing portion 83.

The casing 85 refers to a case that accommodates the components of the clamp mechanism part 80 including the driving unit 86, except for the clamp member 81. The casing 85 includes a movable casing portion 83 and a fixed casing portion 84.

The movable casing portion 83 refers to a casing portion movable up and down together with the clamp fixing member 82, and the clamp member 81 is connected to the movable casing portion 83. The movable casing portion 83 covers the clamp fixing member 82 and the most part of the cylinder rod 86b of the driving unit 86. Among the components of the driving unit 86, the cylinder rod 86b is configured to be driven and moved by the driving force and performs a function to deliver the driving force to an object to be driven. In FIG. 7, the cylinder rod 86b is fixed to the bottom surface of the movable casing portion 83 by the cylinder rod fixing member 86d, so as to deliver the driving force of the up-and-down movement to the movable casing portion 83. The movable casing portion 83 functions as a clamp arm that supports the clamp member 81 and delivers the driving force of the up-and-down movement to the clamp member 81. Further, the movable casing portion 83 covers the most part of the cylinder rod 86b which is a dust generation source, so as to suppress scattering of particles P2 generated from the cylinder rod 86. That is, the movable casing portion 83 functions as a clamp arm and a scattering prevention cover.

Further, while the movable casing portion 83 has a cuboid shape at the lower portion thereof, the top surface thereof is formed by an inclined flat surface. The top surface is inclined in order to prevent the top surface from coming in contact with the driving force generating unit 86a even if the movable casing portion 83 moves up, and to widen the vertical movable range of the movable casing portion 83.

The fixed casing portion 84 refers to a casing portion that covers the driving force generating unit 86a of the driving unit 86, the upper portion of the cylinder rod 86b, the linear guide 87, and the local exhaust duct 88. The fixed casing portion 84 refers to a casing portion that is provided to be fixed to the partition wall 4 in a stationary state. The fixed casing portion 84 basically accommodates the stationary components of the driving unit 86.

Figure 8:
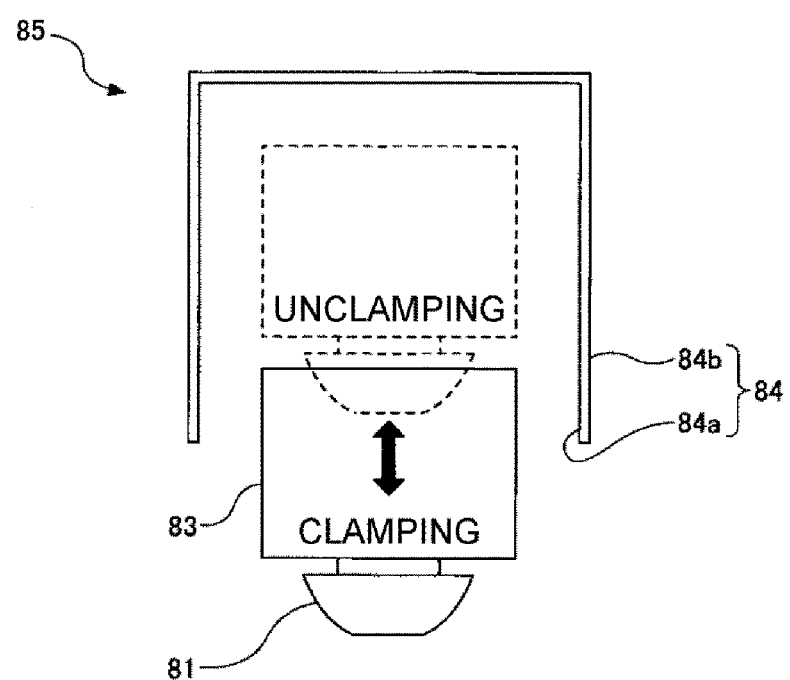
FIG. 8 is a front view illustrating a configuration of an exemplary casing.

FIG. 8 is a front view illustrating a configuration of an exemplary casing 85. As illustrated in FIG. 8, a fixed casing portion 84 is configured to be opened on the bottom side to include an opening portion 84a. In addition, a movable casing portion 83 is inserted into the opening portion 84a of the fixed casing portion 84 to be movable up and down, thereby configuring the casing 85. The movable casing portion 83 moves up and down along the side surfaces 84b of the fixed casing portion 84. The movable casing portion 83 moves down to protrude from the opening portion 84a when clamping a carrier C, and moves up to be accommodated in the opening portion 84a when unclamping the carrier C.

Referring to FIG. 7 again, it may be understood that the fixed casing portion 84 and the movable casing portion 83 have a structure in which the movable casing portion 83 is inserted into the opening portion 84a on the bottom surface of the fixed casing portion 84 to be movable up and down. The fixed casing portion 84 generally has a cuboid shape that does not have a bottom side.

An opening 84c is provided in the side surface 84b of the fixed casing portion 84 such that particles within the casing 85 can be discharged to the outside of the casing 85. This will be described later.

The driving unit 86 is a means for driving the clamp member 81 up and down, and includes a driving force generating unit 86a, a cylinder rod 86b, an air duct 86c, and a cylinder rod fixing member 86d as described above.

The driving force generating unit 86a generates a driving force of an up-and-down movement. In the example of FIG. 7, the clamp member 81 is driven by air driving. Thus, the driving force generating unit 86a is formed as an air cylinder. Accordingly, air is supplied to the driving force generating unit 86a so that the cylinder rod 86b is driven.

The cylinder rod 86b refers to a moving portion that is moved by the driving force generated in the driving force generating unit 86a and delivers the driving force generated in the driving force generation unit 86a by connecting the movement to an object to be driven. In the example of FIG. 7, the movable casing portion 83 is connected to the bottom end of the cylinder rod 86b via the cylinder rod fixing member 86d. The driving force generated in the driving force generation unit 86a is delivered to the movable casing portion 83 through the cylinder rod 86b so that the movable casing portion 83 moves up and down.

The air duct 86c refers to a duct that discharges the air supplied to the driving force generating unit 86a which is formed as an air cylinder. Since the air cylinder is a mechanical structure, there is a possibility that dusts occur due to the leakage of the air discharged from the air duct 86c. Thus, particles P1 generated by the dusts occurring due to the air leakage also become an object to be exhausted by the local exhaust duct 88.

The linear guide 87 refers to a member that guides the up-and-down movement of the movable casing portion 83 that moves up and down as a clamp arm. The linear guide 87 includes a fixed linear guide portion 87a and a movable linear guide portion 87b, both of which have a substantially cuboid shape. The linear guide 87 is configured by externally fitting the movable linear guide portion 87b to the fixed linear guide portion 87a, and contributes to the linear up-and-down movement of the movable casing portion 83 along the linear guide 87. Further, the movable linear guide portion 87b is fixedly attached to the rear side outer surface of the movable casing portion 83 and moves up and down along the fixed linear guide portion 87a when the movable casing portion 83 moves up and down, thereby guiding the up-and-down movement of the movable casing portion 83. Two linear guides 87 may be arranged side by side in order to effectively guide the track of the up-and-down movement of the movable casing portion 83. FIG. 7 illustrates an example where two linear guides 87 are arranged.

In addition, both the driving unit 86 and the linear guide 87 are mechanical components and cooperate with each other to act as a part of a driving mechanism involved in the up-and-down driving of the movable casing portion 83. Accordingly, the driving unit 86 and the linear guide 87 constitute a driving mechanism that causes the clamp member 81 and the movable casing portion 83 to move up and down.

The local exhaust duct 88 refers to a duct that exhausts dusts occurring from the driving unit 86 and the linear guide 87 and is selectively disposed near the driving unit 86 and the linear guide 87. As illustrated in FIG. 7, in the driving unit 86, particles P1 may be generated by dusts occurring due to the leakage of air, and particles P2 may be generated by dusts occurring from the cylinder rod. Further, particles 3 may also be generated by the dusts occurring from the linear guide 87. Accordingly, the local exhaust duct 88 performs a function to suck and exhaust the particles P1 to P3 generated by the dusts occurring from the driving mechanism, thereby suppressing the particles P1 to P3 from being scattered from the clamp mechanism part 80.

The local exhaust duct 88 generally has a T shape and includes suction ports 88a at the opposite side surfaces of the vertically extending portion thereof. As illustrated in FIG. 7, since the suction ports 88a are close to the particles P1 generated by the dusts occurring due to air leakage, the particles 2 generated by the dusts occurring from the cylinder rod, and the particles P3 generated by the dusts occurring from the linear guide, the suction ports 88a are able to effectively suck the particles P1 to P3 generated from the occurring dusts so that the inside of the casing 85 may be kept clean.

In the local exhaust duct 88, the opposite ends of the horizontally extending portion of the T shape are formed as discharge ports 88*b*, each of which is connected to the discharge port 84*c* of the fixed casing portion 84. By this configuration, the local exhaust duct 88 has a structure in which the particles P1 to P3 sucked from the suction ports 88*a* can be reliably discharged to the outside of the casing 85.

The local exhaust duct 88 is not an essential component and may be provided as needed. That is, even when the local exhaust duct 88 is not provided, the particles P1 to P3 may be discharged to the outside of the casing 85 directly from the discharge port 84*c* of the fixed casing portion 84.

However, since the discharge port 84*c* of the fixed casing portion 84 is not provided at a location where dusts frequently occur in the driving unit 86 and the linear guide 87, the suction force may not effectively act on the particles P1 to P3 even if the suction is performed from the discharge port 84*c* of the fixed casing portion 84. When the local exhaust duct 88 is provided, the suction force may act on the vicinity of a location where dusts frequently occur in the driving unit 86 and the linear guide 87, thereby effectively sucking the particles P1 to P3. Accordingly, the local exhaust duct 88 may be provided from the viewpoint of effectively discharging the particles P1 to P3.

Next, the entire configuration of the clamp apparatus 100 will be described.

Figure 9:
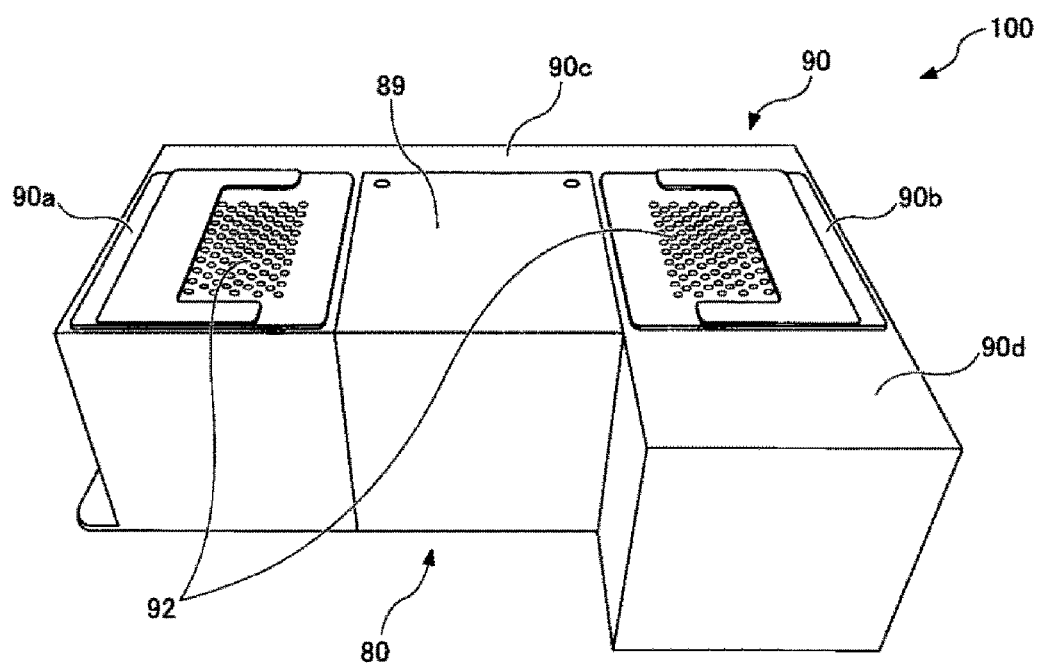
FIG. 9 is a front perspective view illustrating the whole configuration of the exemplary clamp apparatus according to the exemplary embodiment of the present disclosure.

FIG. 9 is a front perspective view illustrating an entire configuration of an exemplary clamp apparatus 100. As illustrated in FIG. 9, the clamp apparatus 100 includes a clamp mechanism part 80 described above with reference to FIGS. 7 and 8, in the center thereof, and exhaust chambers 90 at the opposite sides of the clamp mechanism part 80. The exhaust chambers 90 include a first exhaust chamber 90*a* provided on the front left side of the clamp mechanism part 80, a second exhaust chamber 90*b* provided on the front right side of the clamp mechanism part 80, and a third exhaust chamber 90*c* provided on the rear side of the clamp mechanism part 80 to interconnect the first exhaust chamber 90*a* and the second exhaust chamber 90*b*. Further, the clamp mechanism part 80 is covered by a clamp cover 89 that has the same outer shape as that of each of the first and second exhaust chambers 90*a* and 90*b* and forms a shape continuous and integral with the first and second exhaust chambers 90*a* and 90*b*.

A fan-built-in suction port 92 is formed on the top surface of each of the first and second exhaust chambers 90*a* and 90*b*. Although not illustrated in FIG. 9, since a fan and a cleaning filter are provided inside each of the first and second exhaust chambers 90*a* and 90*b*, the first and second exhaust chambers 90*a* and 90*b* are configured to be capable of sucking a gas containing particles P1 to P3 from the clamp mechanism part 80, also sucking and blowing a gas from the outside of the clamp apparatus 100, and supplying a gas purified through the cleaning filter to a carrier C. As the details of the internal structure of the first and second exhaust chambers 90*a* and 90*b* will be described later, a plurality of fan-built-in suction ports 92 are provided on the top surface of each of the first and second exhaust chambers 90*a* and 90*b* such that the gas from the outside of the clamp apparatus 100 is also sucked by the built-in fans.

An accommodating unit 90*d* is provided at the front side of the second exhaust chamber 90*b*. The accommodating unit 90*d* is integrally formed with the second exhaust chamber 90*b* in view of an external appearance, but does not have a function as an exhaust chamber. The accommodating unit 90*d* accommodates other parts. Such an accommodating unit 90*d* may not be provided.

Figure 10:
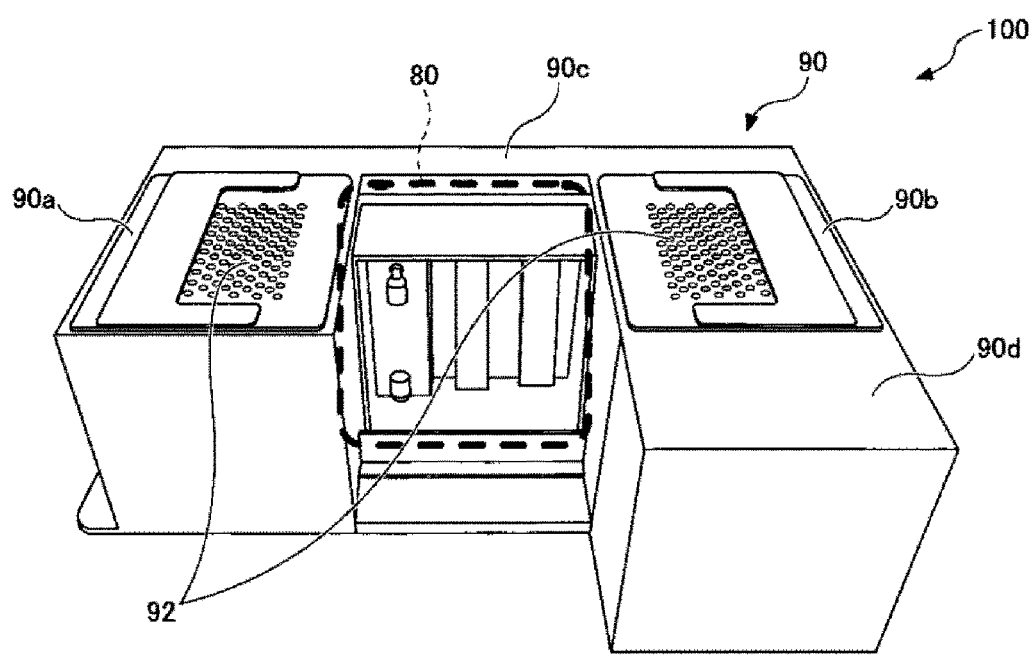
FIG. 10 is a view illustrating the exemplary clamp apparatus according to the exemplary embodiment of the present disclosure in a state in which a clamp cover is removed.

FIG. 10 is a view illustrating an exemplary clamp apparatus 100 in a state where the clamp cover 89 is detached. As illustrated in FIG. 10, the clamp mechanism part 80 is disposed in the central rear side of the clamp apparatus 100. When the clamp mechanism part 80 is covered by the clamp cover 89, the clamp mechanism part 80 may form an integral external appearance with the exhaust chamber 90.

Figure 11A:
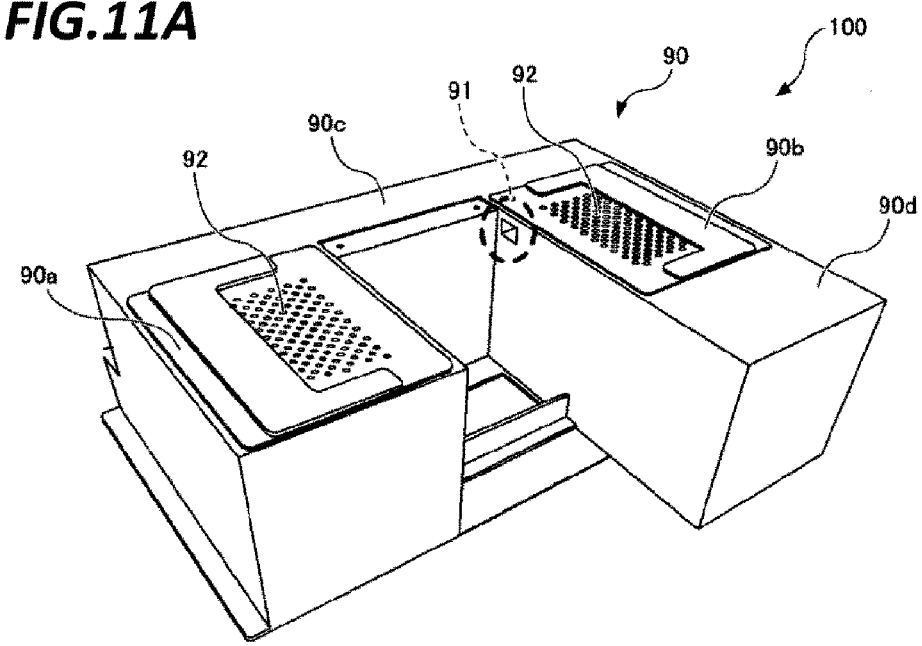
FIGS. 11A and 11B are views illustrating an exemplary local exhaust suction port formed in an exhaust chamber.
Figure 11B:
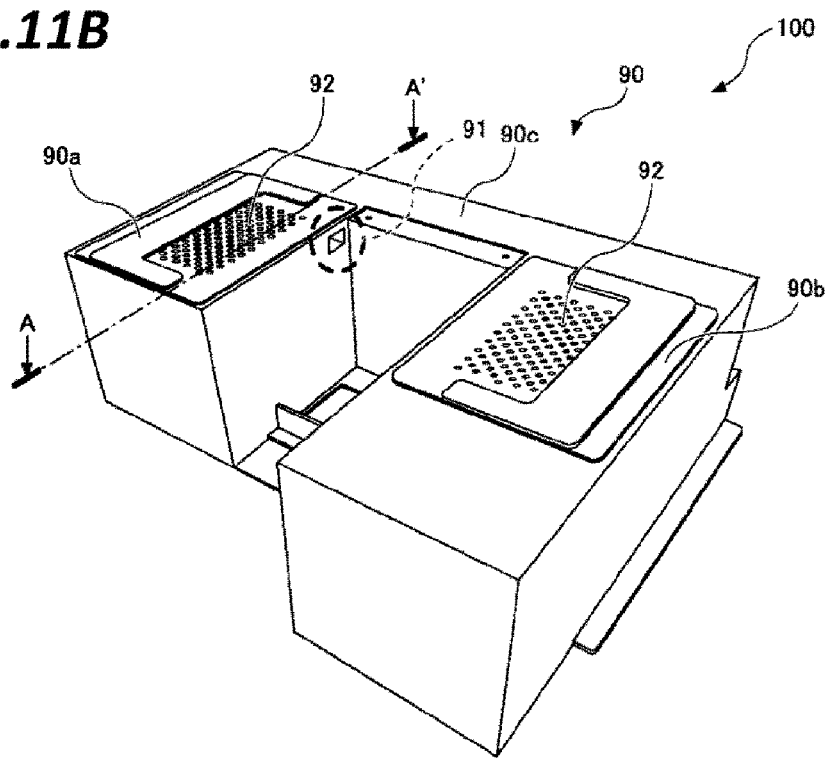

FIGS. 11A and 11B are views illustrating an exemplary local exhaust suction port 91 formed in the exhaust chamber 90. As illustrated in FIGS. 11A and 11B, the local exhaust suction port 91 is formed on the side surface of each of the first and second exhaust chambers 90*a* and 90*b*. The local exhaust suction port 91 is a suction port configured to suck a gas containing particles P1 to P3 generated within the casing 85 of the clamp mechanism part 80, from the discharge port 84*c* formed on the side surfaces 84*b* of the fixed casing portion 84. When a local exhaust duct 88 is provided inside the fixed casing portion 84, the discharge port 88*b* of the local exhaust duct 88 is connected to the local exhaust suction port 91.

Figure 12:
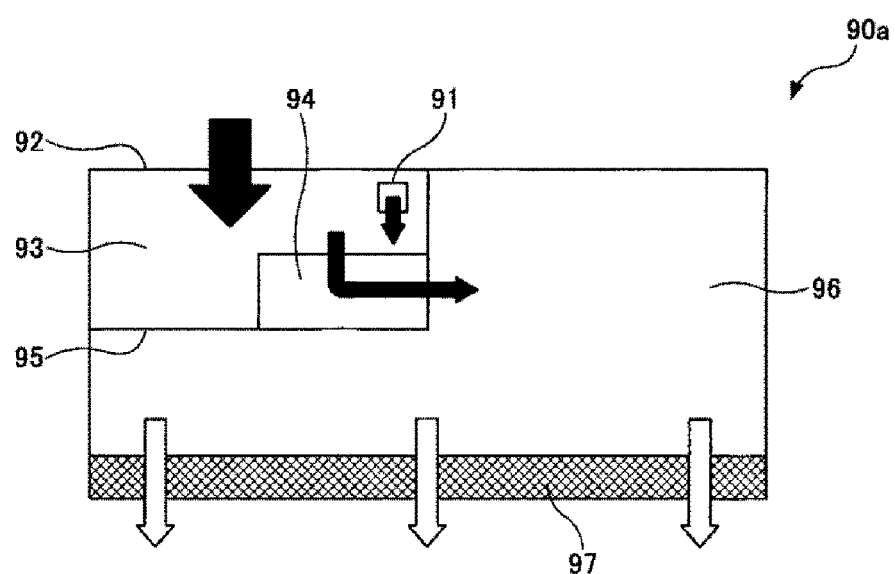
FIG. 12 is a side cross-sectional view of an exemplary first exhaust chamber.

FIG. 12 is a side cross-sectional view of the exemplary first exhaust chamber 90*a*. More specifically, FIG. 12 illustrates a cross section of the first exhaust chamber 90*a* taken along line A-A' in FIG. 11B.

The first exhaust chamber 90*a* includes a local exhaust suction port 91, a fan-built-in suction port 92, a negative pressure chamber 93, a fan 94, a partition 95, a positive pressure chamber 96, and a filter 97. The inside of the first exhaust chamber 90*a* is divided into a negative pressure chamber 93 and a positive pressure chamber 96 by a partition 95. The negative pressure chamber 93 is provided in the upper portion of the first exhaust chamber 90*a* to communicate with the local exhaust suction port 91 and the fan-built-in suction port 92. The negative pressure chamber 93 is provided with the fan 94 therein and configured to suck, through the fan 94, the gas containing particles P1 to P3 from the local exhaust suction port 91 and the external gas of the clamp apparatus 100 from the fan-built-in suction port 92. The gas containing the particles P1 to P3 from the local exhaust suction port 91 and the external gas of the clamp apparatus 100 from the fan-built-in suction port 92 join with each other in the negative pressure chamber 93. Through the exhaust by the fan 94, the inside of the negative pressure chamber 93 is kept in a negative pressure state which is lower in pressure than the outside of the clamp apparatus 100. The fan 94 is configured to blow the gas containing the particles P1 to P3 from the local exhaust suction port 91 and the external gas of the clamp apparatus 100 from the fan-built-in fan suction port 92 into the positive pressure chamber 96.

The positive pressure chamber 96 occupies the area inside the first exhaust chamber 90*a*, except for the negative pressure chamber 93, i.e., the portion under the negative pressure chamber 93, and the upper and lower portions of the area where the negative pressure chamber 93 does not exist. The filter 97 is provided on the bottom surface of the positive pressure chamber 96. The filter 97 is a cleaning filter configured to clean a gas and, for example, a HEPA filter and an ULPA filter may be used as described above. The gas cleaned by the filter 97 is supplied as a down flow to the periphery of the predetermined position where a carrier C is fixed. The fan 94 continuously operates before the carrier C is placed on the FIMS port 24 so that the clean gas is always supplied as a down flow onto each of the FIMS ports 24. The carrier C takes a shower in the clean gas supplied from the upper side during the time the carrier C moves closer to the predetermined position at which the cover 68 is opened.

Accordingly, the particles attached to the vicinity of the cover 68 of the carrier C may be removed by the down flow of the clean gas before the cover 68 of the carrier C is opened so that the particles in the vicinity of the cover 68 may be suppressed from being mixed into the wafer transfer section S2 when the cover 68 is opened.

As described above, the clamp apparatus 100 according to the present exemplary embodiment may not only suppress the particles generated in the clamp mechanism part 80 from being scattered to the outside, but also perform the cleaning of the carrier C. Therefore, a wafer W may be carried into the wafer transfer section S2 in the clean state even in an environment where the cleanliness in the clean room is deteriorated.

It is not essential that the filter 97 is disposed on the bottom surface of the positive pressure chamber 96. The filter 97 may be disposed in various positions as long as the gas cleaned through the filter 97 may be supplied as a down flow to the periphery of the predetermined position at which the carrier C is placed.

In the present exemplary embodiment, the first and second exhaust chambers 90a and 90b are disposed in the vicinity of the top surface of the carrier C. However, the first and second exhaust chambers 90a and 90b may be disposed in the vicinity of the side surfaces of the carrier C so as to supply a side flow to the side surfaces of the carrier C.

The positive pressure chamber 96 is kept in a positive pressure state which is higher in pressure than the outside of the clamp apparatus 100 since the gas is blown from the fan 94. The second exhaust chamber 90b may also be configured to be the same as the first exhaust chamber 90a illustrated in FIG. 12, or for example, the fan 94 and the filter 97 may be separately provided in the second exhaust chamber 90b. The third exhaust chamber 90c, which interconnects the first exhaust chamber 90a and the second exhaust chamber 90b, is configured as a positive pressure passage that communicates with the positive pressure chamber 96.

Figure 13:
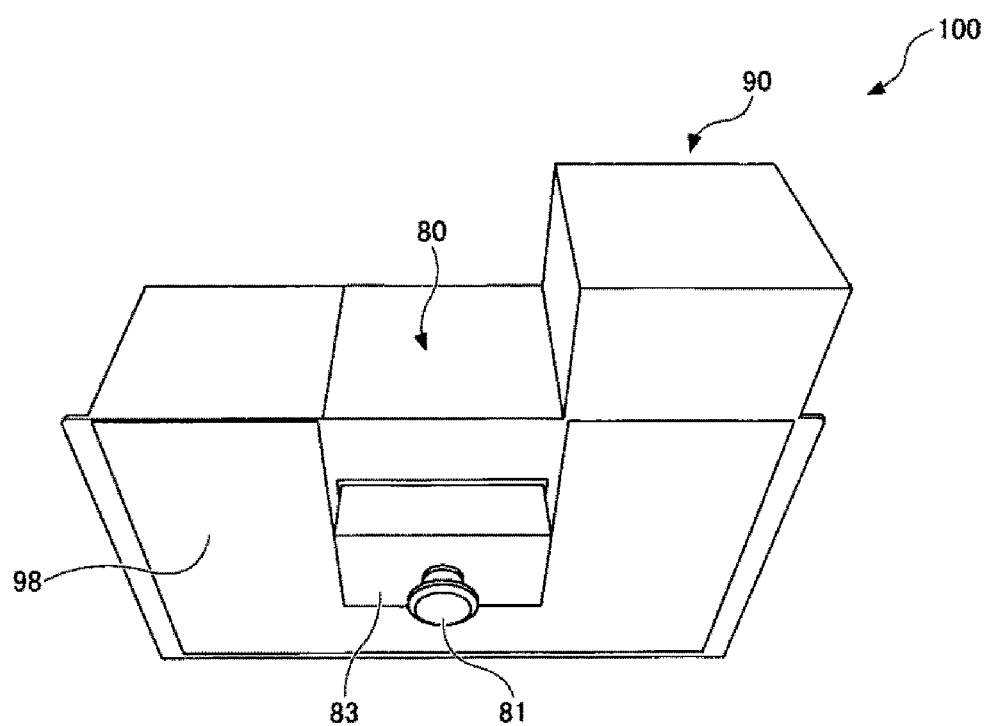
FIG. 13 is a perspective view illustrating a bottom surface of the clamp apparatus according to the exemplary embodiment of the present disclosure.

FIG. 13 is a perspective view illustrating the bottom surface of the clamp apparatus 100. The bottom surface 98 of the exhaust chamber 90 of the clamp apparatus 100 is configured as a blowout surface of a clean gas (e.g., clean air) and supplied with the gas cleaned by the filter 97. As illustrated in FIG. 13, the clamp member 81 and the movable casing portion 83 are disposed on the bottom surface of the clamp mechanism part 80 so that a carrier C can be clamped and fixed.

Figure 14:
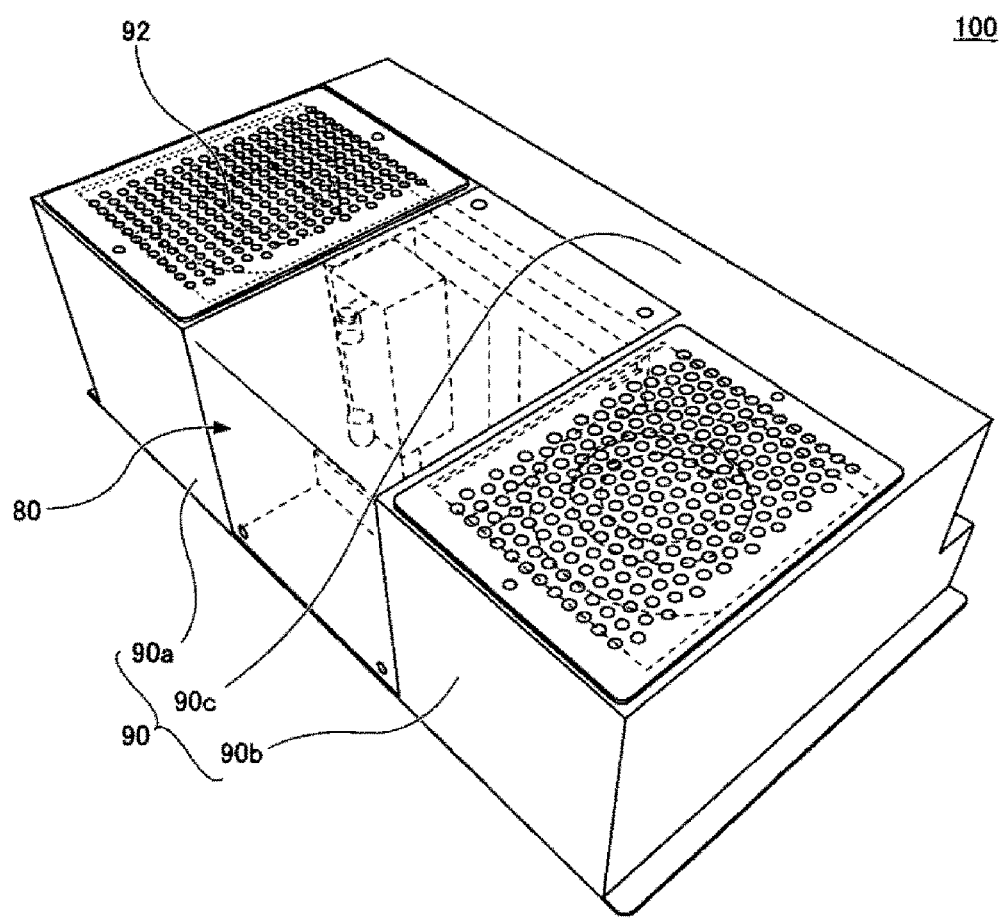
FIG. 14 is a perspective view illustrating the whole exemplary clamp apparatus according to the exemplary embodiment of the present disclosure.

FIG. 14 is a perspective view illustrating the whole of an exemplary clamp apparatus 100 according to the present exemplary embodiment. In the clamp apparatus 100 illustrated in FIG. 14, the accommodating unit 90d is removed, and the first exhaust chamber 90a and the second exhaust chamber 90b are symmetric to each other. As illustrated in FIG. 14, the fan-built-in suction ports 92 formed on the top surfaces of the first and second exhaust chambers 90a and 90b are formed on the most areas of the top surfaces of the first and second exhaust chambers 90a and 90b. In order to cause the fans 94 to sufficiently blow the gas to the filters 97, a large number of fan-built-in suction ports 92 may be formed.

Figure 15:
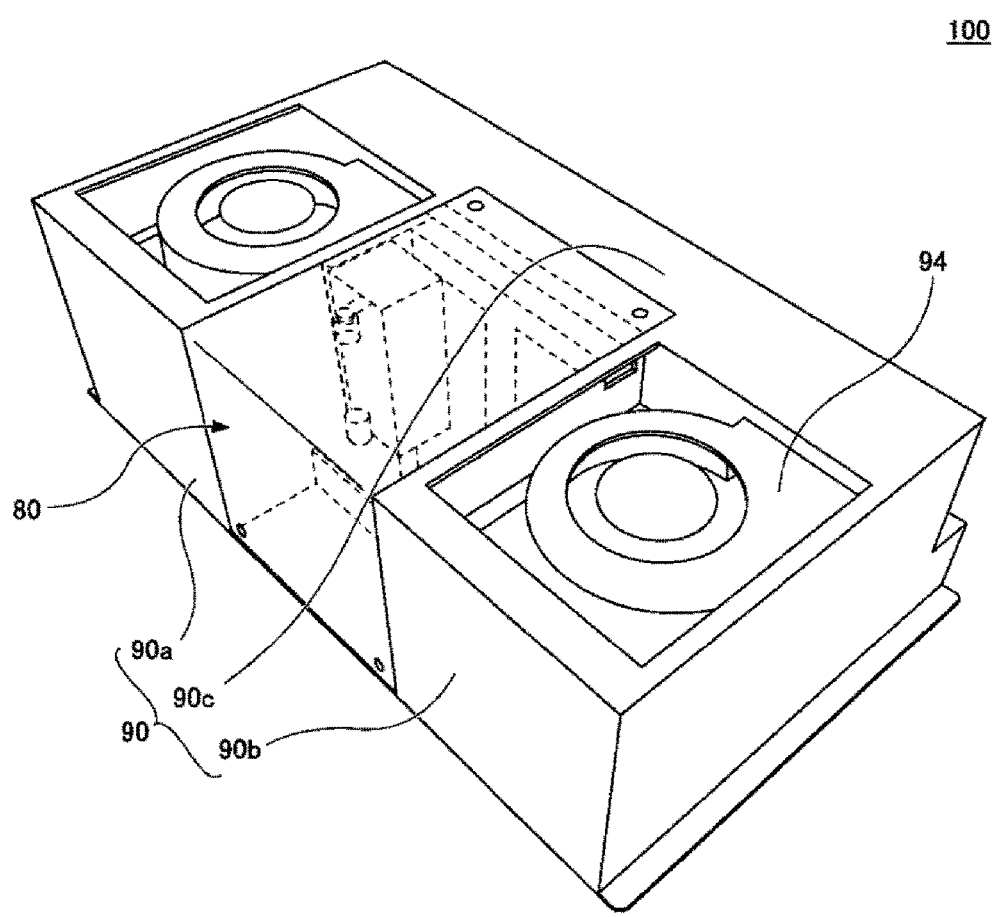
FIG. 15 is a perspective view illustrating an internal configuration of a first exhaust chamber and a second exhaust chamber of the exemplary clamp apparatus according to the exemplary embodiment of the present disclosure.

FIG. 15 is a perspective view illustrating the internal configuration of the first and second exhaust chambers 90a and 90b of an exemplary clamp apparatus 100 according to the present exemplary embodiment. FIG. 15 represents the fans 94 that are provided inside the first and second exhaust chambers 90a and 90b. For the fans 94, various fans 94 may be used as long as the fans are able to blow the gas sucked from the fan-built-in suction port 92 to the positive pressure chamber 96. For example, a sirocco fan may be used. The sirocco fan refers to a fan that is able to blow the gas sucked from the upper side in the rotating axis direction of the fan in the rotating direction of the rotating axis. The sirocco fan is able to perform blowing in a direction different from the blowing direction of an axial fan that blows a gas from one side of the rotating axis of the fan toward the other side thereof. As illustrated in FIG. 12, the negative pressure chamber 93 provided with a fan 94 therein has a flat shape. Further, as illustrated in FIG. 1, the space where the clamp apparatus 100 may be disposed is very small and narrow compared to the height of the carriers C. In order to dispose a fan 94 in such a small space and perform the local exhaust, a fan 94 adaptable to the flat shape may be used. Accordingly, in the clamp apparatus 100 according to the present exemplary embodiment, for example, the sirocco fan is used as the fan 94. However, since the clamp apparatus 100 may be applied to various substrate processing apparatuses, and a use, in which the clamp apparatus 100 occupies a sufficient space, is also conceived, a suitable fan 94 may be selected and used depending on the use of the clamp apparatus 100.

Figure 16:
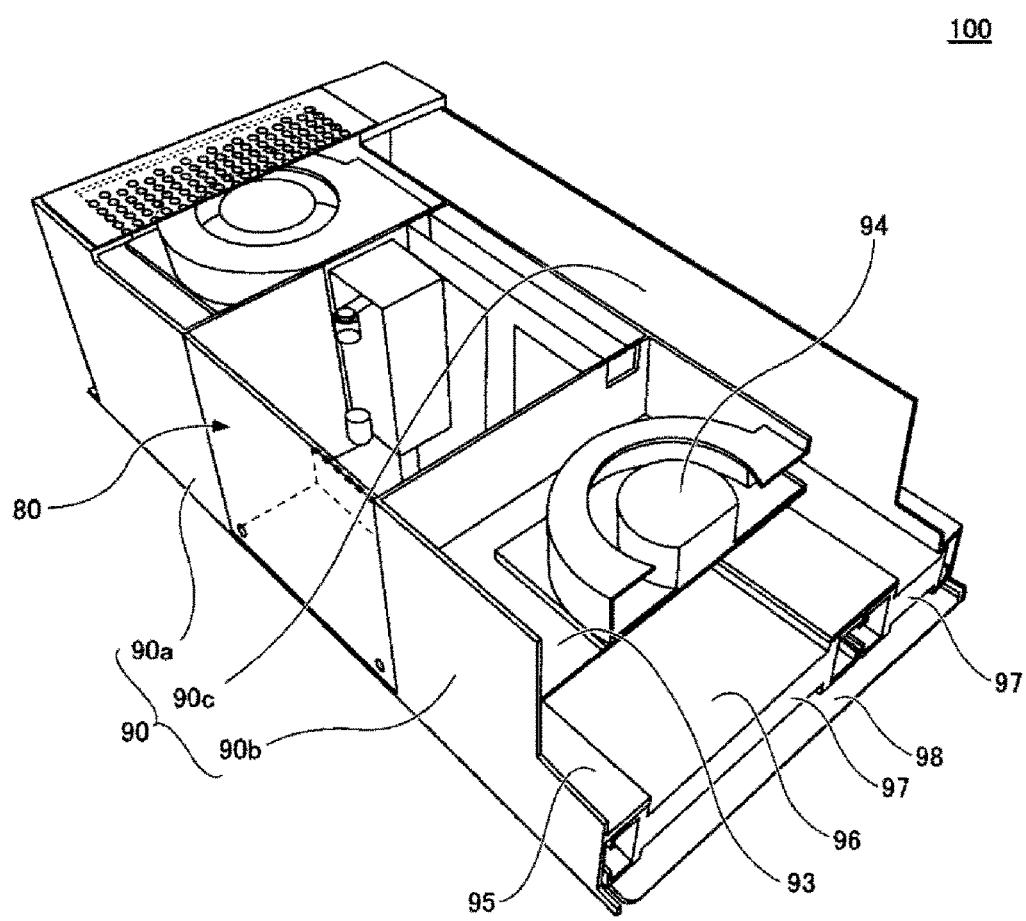
FIG. 16 is an exploded perspective view illustrating an internal configuration of the exhaust chamber of the exemplary clamp apparatus according to the exemplary embodiment of the present disclosure.

FIG. 16 is an exploded perspective view illustrating the internal configuration of the exhaust chamber 90 of the exemplary clamp apparatus 100 according to the present exemplary embodiment. As illustrated in FIG. 16, the negative pressure chamber 93 and the positive pressure chamber 96 are partitioned by the partition 95. The filter 97 is provided on the bottom surface of the positive pressure chamber 96. Such a filter 97 is also provided on the bottom surface of the third exhaust chamber 90c, in addition to the first and second exhaust chambers 90a and 90b. By this configuration, the clean gas may be supplied to a relatively wide area of each of the FIMS ports 24 as a down flow so that the carrier C may be reliably cleaned.

Figure 17:
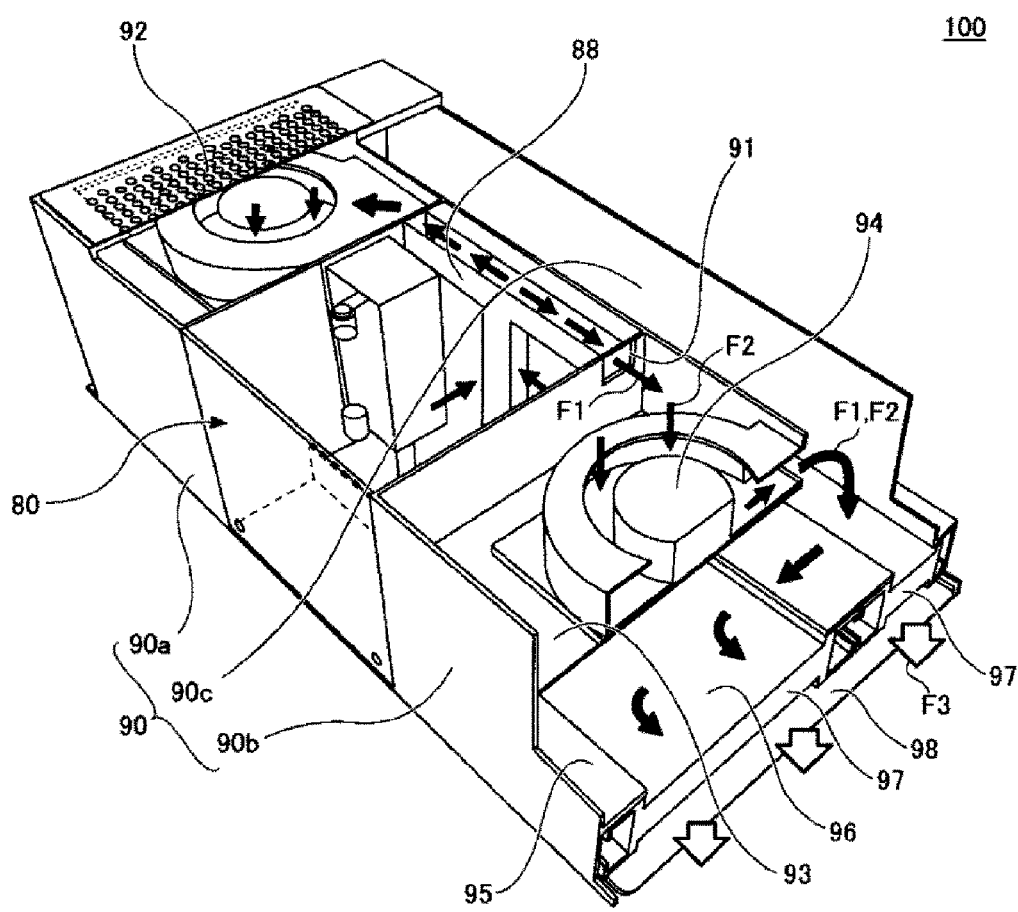
FIG. 17 is a view illustrating a gas flow in the exhaust chamber of the exemplary clamp apparatus according to the exemplary embodiment of the present disclosure.

FIG. 17 is a view illustrating a gas flow in the exhaust chambers 90 of an exemplary clamp apparatus 100 according to the present exemplary embodiment. As illustrated in FIG. 17, the gas F1 containing particles P1 to P3 generated in the clamp mechanism part 80 is sucked from the local exhaust suction port 91 and sent to the negative pressure chambers 93 of the first and second exhaust chambers 90a and 90b. The gas F2 sucked from the fan-built-in suction ports 92 formed on the top surfaces of the first and second exhaust chambers 90a and 90b is sent to the negative pressure chambers 93 of the first and second exhaust chambers 90a and 90b. The gases F1 and F2 are joined with each other in the negative pressure chamber 93 and are sent by the fan 94 from the negative pressure chamber 93 to the positive pressure chamber 96. The gasses F1 and F2 sent to the positive pressure chamber 96 are cleaned through the filters 97, and the cleaned gas F3 is supplied from the bottom surface 98 of the exhaust chamber 90 toward the lower side.

As described above, according to the clamp apparatus 100 of the present exemplary embodiment, the scattering of the particles P1 to P3 generated from the driving mechanism of the clamp mechanism part 80 may be suppressed, and a clean gas may be supplied as a down flow like a shower to the carrier C transferred on the FIMS port 24 so that the particles in the vicinity of the cover 68 can be removed. Therefore, when a wafer W is carried into the wafer transfer section S2, and when a wafer W is carried out from the wafer transfer section S2 to the carrier transfer section S1, particles can be effectively suppressed from being mixed into the wafer transfer section S2.

An apparatus for carrying in/out a substrate is configured by the clamp apparatus 100, the FIMS ports 24, and the cover opening/closing apparatus 7 including the door mechanism 8 according to the present exemplary embodiment.

[Operation]

Next, descriptions will be made on an operation to transfer a wafer W by using the substrate carry-in/out apparatus, which includes the clamp apparatus 100 according to the present exemplary embodiment, and the wafer transfer mechanism 56.

First, as illustrated in FIGS. 1 and 2, the load port, on which a carrier C is placed, is moved toward the FIMS port 24 side in the second horizontal direction by a predetermined distance.

Next, the hand unit 44 is moved to a position where the positioning pins 18 of the hand unit 44 and the positioning grooves 78 of the bottom surface of the carrier C are engaged with each other.

Then, the hand unit 44 is moved up and then placed on the carrier C.

Next, the hand unit 44 is further moved up so that the carrier C is taken off from the load port 14.

Then, the hand unit 44, on which the carrier C is placed, is transferred from the load port 14 side to the FIMS port 24. Next, the hand unit 44, on which the carrier C is placed, is moved to the upper side of the FIMS port 24 and then moved down to be placed on the FIMS port 24.

The carrier C slides and moves toward the transfer port 6 of the partition wall 4. When the carrier C reaches a predetermined position, the clamp member 81 of the clamp apparatus 100 moves down and fixes the carrier C. Then, a down flow by a clean gas is supplied like a shower from the bottom surface 98 of the clamp apparatus 100 so that the cover 68 of the carrier C and a periphery thereof are cleaned.

The cover 68 is opened by the door mechanism 8 of the cover opening/closing apparatus 7. Since the cover 68 and the periphery thereof are cleaned, no particles are mixed into the wafer transfer section S2 even when the cover 68 is opened. Further, the particles generated in the driving mechanisms 86 and 87 within the clamp mechanism part 80 of the clamp apparatus 100 are also not scattered.

Wafers W are transferred onto the wafer boat 50 by the wafer transfer mechanism 56. After a predetermined number of wafers W are placed on the wafer boat 50, the wafer boat 50 is carried into the heat treatment furnace 26 so that a predetermined heat treatment is performed.

After the heat treatment is finished, the treated wafers W are carried out from the heat treatment furnace 26 to the carrier C on the FIMS port 24 by the wafer transfer mechanism 56. At this time, since the clean gas is still supplied to the carrier C from the clamp apparatus 100, particles can be suppressed from being mixed into the wafer transfer section S2.

As described above, according to the clamp apparatus 100, the substrate carry-in/out apparatus, and the substrate processing apparatus according to the present exemplary embodiment, since a clean gas is supplied as a down flow from the clamp apparatus 100 provided above a FIMS port 24, the particles to be mixed into the wafer transfer section S2 may be reduced when the wafers W are transferred between a carrier C and the wafer transfer section S2.

Test Example

Figure 18:
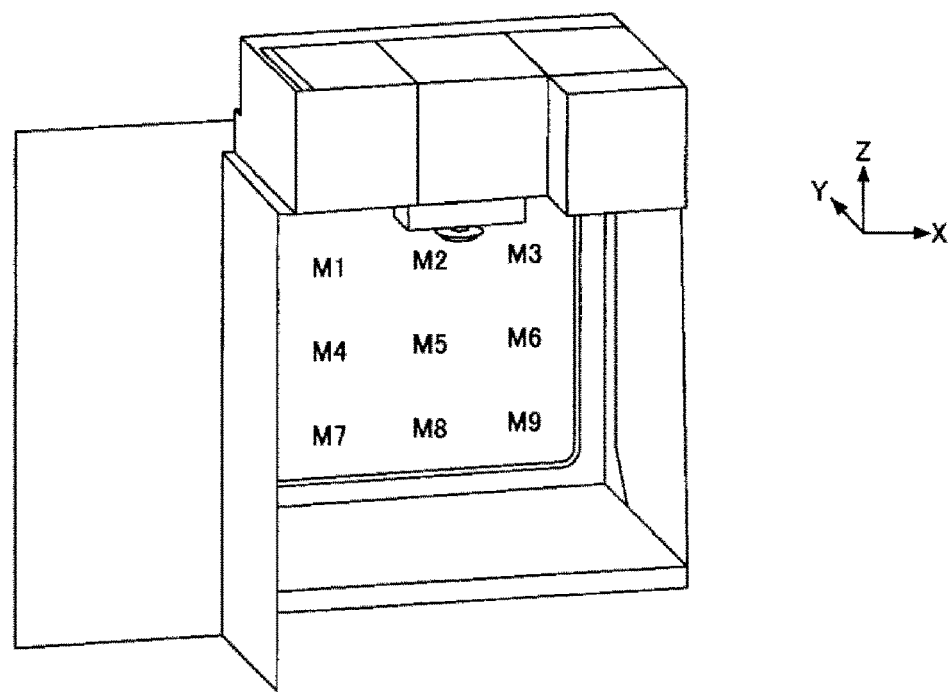
FIG. 18 is a view illustrating particle measurement points in the clamp apparatus according to the exemplary embodiment of the present disclosure.

Next, descriptions will be made on a test example conducted using the clamp apparatus according to the present exemplary embodiment with reference to FIGS. 18 and 19. FIG. 18 is a view illustrating particle measurement points in the clamp apparatus according to an exemplary embodiment of the present disclosure. As illustrated in FIG. 18, measurement points M1 to M9 were set at nine positions of the door mechanism. Further, the number of particles was measured prior to and after the operation of the clamp apparatus according to the present exemplary embodiment.

In order to exhibit the effect of the clamp apparatus according to the present exemplary embodiment, measurements were conducted not in an environment of a clean room level, but in a state close to a typical room level where the number of particles is larger than that in the clean room level.

Figure 19:
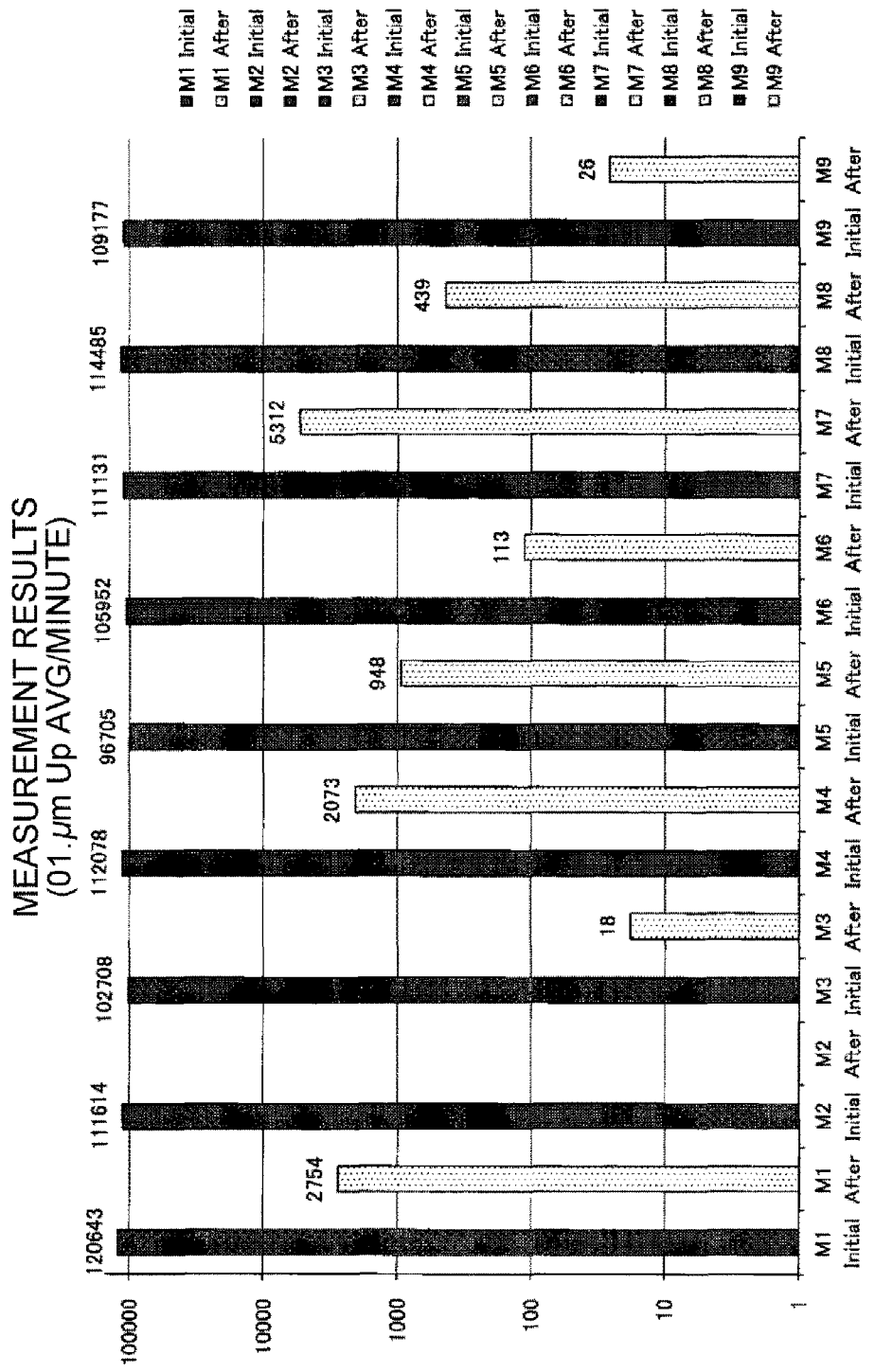
FIG. 19 is a view illustrating results of the measurement of the clamp apparatus according to the exemplary embodiment of the present disclosure.

FIG. 19 is a view illustrating measurement results of the clamp apparatus according to the present exemplary embodiment. FIG. 19 represents the measurement results at the respective measurement points M1 to M19 prior to the operation of the clamp apparatus (Initial) and after the operation of the clamp apparatus (After).

As illustrated in FIG. 19, the number of particles is reduced from the level of 10,000 to the level of tens to thousands at all the measurement points M1 to M2 so that it was possible to reduce the number of particles by about 90% or more.

As described above, according to the clamp apparatus of the present exemplary embodiment, it is possible to largely reduce particles in the vicinity of the door mechanism that performs opening and closing are able to be largely reduced, and thus to remarkably reduce particles mixed into the wafer transfer section.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A clamp apparatus comprising:
a clamp member configured to come in contact with a substrate accommodating container from an upper side so as to fix the substrate accommodating container to a predetermined position when a cover provided on a front side of the substrate accommodating container is opened/closed;
a driving mechanism configured to drive the clamp member;
a casing configured to cover the driving mechanism; and
an exhaust chamber including a first exhaust chamber provided at a left side of the casing, a second exhaust chamber provided at a right side of the casing, and a third exhaust chamber provided at a rear side of the casing and between the first exhaust chamber and the second exhaust chamber and configured to interconnect the first exhaust chamber and the second exhaust chamber when viewed in a front side thereof, each of the first exhaust chamber and the second exhaust chamber including a first suction port on a side surface thereof that is configured to communicate with the casing,
wherein each of the first exhaust chamber and the second exhaust chamber is divided into a negative pressure chamber provided at an upper portion of each of the first exhaust chamber and the second exhaust chamber and including a fan therein and a second suction port provided on a top surface thereof, and a positive pressure chamber occupied by an area except for the negative pressure chamber within each of the first exhaust chamber and the second exhaust chamber and including a cleaning filter configured to clean a gas on a bottom surface thereof, and the fan is configured to suck a gas from the first suction port into the negative pressure chamber while sucking a gas from an outside of the second suction port into the negative pressure chamber to mix the gas from the first suction port with the gas from the outside of the second suction port in the negative pressure chamber such that the mixed gases are sent to the positive pressure chamber, thereby supplying the mixed gases to a predetermined position where the substrate accommodating container is fixed in a down flow while cleaning the mixed gases through the cleaning filter.

2. The clamp apparatus of claim 1, further comprising:
a local exhaust duct provided inside the casing, having a T-shape and selectively disposed near the driving mechanism,
wherein the local exhaust duct includes a first part extended in a horizontal direction and having discharge ports at both ends thereof, and a second part extended in a vertical direction and connected to the first part.

3. The clamp apparatus of claim 2, wherein the first part of the local exhaust duct communicates with the first suction port of each of the first exhaust chamber and the second exhaust chamber such that the first exhaust chamber and the second exhaust chamber communicate with each other.

4. The clamp apparatus of claim 2, wherein the casing is located adjacent to the first exhaust chamber, the second exhaust chamber and the third exhaust chamber, and
the discharge ports of the first part of the local exhaust duct are directly connected to the first suction port of the first exhaust chamber and the first suction port of the second exhaust chamber, respectively.

5. The clamp apparatus of claim 4, wherein the first exhaust chamber and the second exhaust chamber are provided adjacent to a left side surface and a right side surface of the casing, respectively when viewed in a front side of the casing.

6. The clamp apparatus of claim 2, wherein the casing includes a movable portion connected to the clamp member and configured to be movable up and down together with the clamp member, and a fixed portion configured to accommodate at least a part of the driving mechanism and the local exhaust duct.

7. The clamp apparatus of claim 6, wherein the driving mechanism includes a driving force generating unit configured to generate a driving force and a moving unit configured to move by the driving force,
the movable portion accommodates at least a part of the moving unit, and
the fixed portion accommodates the driving force generating unit.

8. The clamp apparatus of claim 6, wherein the movable portion is provided by being inserted into an opening of a bottom of the fixed portion, and
a wall is formed in at least a part of the periphery of the opening to be parallel with a side surface of the movable portion.

9. The clamp apparatus of claim 1, further comprising:
a cover member having a shape continuous and integral with the first exhaust chamber and the second exhaust chamber, and configured to cover the casing.

10. The clamp apparatus of claim 1, wherein the fan is a sirocco fan.

11. A substrate carry-in/out apparatus comprising:
a substrate transfer section;
a partition wall configured to partition a substrate accommodating container transfer section;
a transfer port provided on the partition wall;
an opening/closing door configured to open/close the transfer port;
the clamp apparatus of claim 1 that is attached to the substrate accommodating container transfer section side of the partition wall above the transfer port; and
a side cover provided on each of opposite sides of the transfer port in a horizontal direction at the substrate accommodating container transfer section side of the partition wall.

12. The substrate carry-in/out apparatus of claim 11, wherein the transfer port, the opening/closing door, the clamp apparatus, and the side cover are provided on the partition wall in two tiers in a vertical direction.

13. The substrate carry-in/out apparatus of claim 11, further comprising:
a cover opening/closing device provided within the substrate transfer section to open/close the cover of the substrate accommodating container.

14. A substrate processing apparatus comprising:
the substrate carry-in/out apparatus of claim 11;
a transfer mechanism provided within the substrate transfer section to transfer a substrate; and
a processing container provided within the substrate transfer section.

15. The substrate processing apparatus of claim 14, wherein the processing container is a heat treatment furnace configured to thermally treat a substrate.

16. The clamp apparatus of claim 2, wherein the second part of the local exhaust duct includes a suction port at each of a front surface and a rear surface thereof when viewed in a front side.

* * * * *